United States Patent
Clark

(10) Patent No.: US 8,865,538 B2
(45) Date of Patent: Oct. 21, 2014

(54) METHOD OF INTEGRATING BURIED THRESHOLD VOLTAGE ADJUSTMENT LAYERS FOR CMOS PROCESSING

(75) Inventor: Robert D Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/436,552

(22) Filed: Mar. 30, 2012

(65) Prior Publication Data

US 2013/0256803 A1 Oct. 3, 2013

(51) Int. Cl.
*H01L 21/8238* (2006.01)

(52) U.S. Cl.
USPC ........... 438/216; 438/275; 438/287; 438/591; 438/592; 257/369; 257/410

(58) Field of Classification Search
USPC ......... 257/368, 369, 392, 402, 410, 411, 412, 257/413, E29.242, E29.255, E29.264, 257/E21.176, E21.177, E21.394, E21.409; 438/199, 216, 217, 261, 276, 287, 289, 438/585, 587, 591, 592
See application file for complete search history.

(56) References Cited

U.S. PATENT DOCUMENTS

| | | | |
|---|---|---|---|
| 6,407,435 B1 | 6/2002 | Ma et al. | |
| 6,617,639 B1 | 9/2003 | Wang et al. | |
| 6,642,131 B2 | 11/2003 | Harada | |
| 6,939,611 B2 | 9/2005 | Fujishima et al. | |
| 7,091,568 B2 | 8/2006 | Hegde et al. | |
| 7,176,531 B1 | 2/2007 | Xiang et al. | |
| 7,226,831 B1 | 6/2007 | Metz et al. | |
| 7,446,380 B2 | 11/2008 | Bojarczuk et al. | |
| 7,772,073 B2 * | 8/2010 | Clark et al. | 438/287 |
| 7,821,083 B2 * | 10/2010 | Wang et al. | 257/410 |
| 7,888,195 B2 | 2/2011 | Lin et al. | |
| 7,952,118 B2 | 5/2011 | Jung et al. | |
| 8,012,827 B2 | 9/2011 | Yu et al. | |
| 8,202,773 B2 | 6/2012 | Niimi et al. | |
| 8,334,183 B2 * | 12/2012 | Clark et al. | 438/287 |
| 8,354,309 B2 * | 1/2013 | Greene et al. | 438/154 |
| 8,357,604 B2 * | 1/2013 | Hoentschel et al. | 438/592 |
| 8,440,520 B2 * | 5/2013 | Clark | 438/199 |

(Continued)

OTHER PUBLICATIONS

Xinyuan Zhao, et al., "First-Principles Study of Electronic and Dielectric Properties of ZrO2 and HfO2", Mat. Res. Soc. Symp. Proc. vol. 745 .COPYRGT. 2003 Materials Research Society, pp. 283-289.

(Continued)

*Primary Examiner* — Fernando L Toledo
*Assistant Examiner* — Christine C Lau

(57) ABSTRACT

A semiconductor device and method of forming. According to one embodiment, the method includes providing a substrate with defined device regions and having an interface layer thereon, depositing a first high-k film on the interface layer, and performing a heat-treatment to form a modified interface layer. The method further includes depositing a first threshold voltage adjustment layer, removing the first threshold voltage adjustment layer from the second device region, depositing a second high-k film above the first high-k film, and depositing a gate electrode film on the second high-k film. A first gate stack is defined that contains the modified interface layer, the first high-k film, the first threshold voltage adjustment layer, the second high-k film, and the gate electrode film, and a second gate stack is defined that contains the modified interface layer, the first high-k film, the second high-k film, and the gate electrode film.

9 Claims, 9 Drawing Sheets

(56) References Cited

U.S. PATENT DOCUMENTS

| | | | |
|---|---|---|---|
| 8,440,559 B2* | 5/2013 | Lenski et al. | 438/591 |
| 8,486,786 B2* | 7/2013 | Kronholz et al. | 438/275 |
| 8,513,074 B2* | 8/2013 | Javorka et al. | 438/199 |
| 2002/0047170 A1 | 4/2002 | Ota | |
| 2002/0172768 A1 | 11/2002 | Endo et al. | |
| 2003/0052374 A1 | 3/2003 | Lee et al. | |
| 2005/0098839 A1 | 5/2005 | Lee et al. | |
| 2005/0238886 A1 | 10/2005 | Gallego | |
| 2005/0245016 A1 | 11/2005 | Pan et al. | |
| 2006/0054943 A1 | 3/2006 | Li et al. | |
| 2006/0081901 A1 | 4/2006 | Arimoto et al. | |
| 2006/0118890 A1 | 6/2006 | Li | |
| 2006/0151823 A1 | 7/2006 | Govindarajan | |
| 2006/0189154 A1 | 8/2006 | Ahn et al. | |
| 2006/0189156 A1 | 8/2006 | Doczy et al. | |
| 2006/0289948 A1 | 12/2006 | Brown et al. | |
| 2007/0032021 A1 | 2/2007 | Park | |
| 2007/0085154 A1 | 4/2007 | Murakawa et al. | |
| 2007/0178634 A1 | 8/2007 | Jung et al. | |
| 2007/0237697 A1 | 10/2007 | Clark | |
| 2008/0081113 A1 | 4/2008 | Clark | |
| 2008/0116543 A1 | 5/2008 | Govindarajan | |
| 2008/0121963 A1 | 5/2008 | Govindarajan | |
| 2008/0308865 A1* | 12/2008 | Wang et al. | 257/345 |
| 2009/0047798 A1 | 2/2009 | Clark et al. | |
| 2009/0108294 A1 | 4/2009 | Choi et al. | |
| 2009/0108356 A1* | 4/2009 | Cheng et al. | 257/365 |
| 2009/0108373 A1* | 4/2009 | Frank et al. | 257/392 |
| 2009/0152650 A1 | 6/2009 | Chudzik et al. | |
| 2010/0044806 A1 | 2/2010 | Hou et al. | |
| 2010/0048010 A1 | 2/2010 | Chen et al. | |
| 2010/0072531 A1 | 3/2010 | Kitti et al. | |
| 2010/0127336 A1 | 5/2010 | Chambers et al. | |
| 2010/0187644 A1 | 7/2010 | Nabatame | |
| 2010/0187982 A1 | 7/2010 | Hsu et al. | |
| 2010/0197128 A1 | 8/2010 | Schaeffer et al. | |
| 2010/0258878 A1 | 10/2010 | Mise et al. | |
| 2010/0289089 A1* | 11/2010 | Carter et al. | 257/392 |
| 2010/0320547 A1 | 12/2010 | Ando et al. | |
| 2010/0327373 A1 | 12/2010 | Carter et al. | |
| 2011/0127616 A1* | 6/2011 | Hoentschel et al. | 257/392 |
| 2011/0227163 A1* | 9/2011 | Wang et al. | 257/369 |
| 2012/0018810 A1 | 1/2012 | Chambers et al. | |
| 2012/0083110 A1 | 4/2012 | Huguenin et al. | |
| 2012/0104506 A1* | 5/2012 | Wang et al. | 257/369 |
| 2012/0119204 A1 | 5/2012 | Wong et al. | |
| 2012/0280288 A1 | 11/2012 | Ando et al. | |
| 2013/0075820 A1* | 3/2013 | Scheiper et al. | 257/368 |

OTHER PUBLICATIONS

Kamimuta et al., "Systematic Study of Vfb Shift in Stacked High-k Bi-layers with Cycle-by-Cycle ALD" Presentation at the ALD 2007 Conference, Jun. 27, 2007 (18 pp).

R. I. Hegde, et al., "Microstructure Modified HfO2 Using Zr Addition With TaxCy Gate for Improved Device Performance and Reliability", IEEE, 2005, (4 pages).

C. Zhao, et al., "Crystallization and Tetragonal-Monoclinic Transformation in ZrO2 and HfO2 Dielectric Thin Films", Key Engineering Materials vols. 206-213 (2002), pp. 1285-1288.

Y. Kuo, et al., "Sub 2 NM Thick Zirconium Doped Hafnium Oxide High-K Gate Dielectrics", ECS Transactions, The Electrochemical Society, 2006, pp. 447-454.

Kyoung-Ryul Yoon, et al., "Performance and Reliability of MIM (Metal-Insulator-Metal Capacitors With ZrO2 for 50nm DRAM Application", Extended Abstracts of the 2005 International Conference on Solid State Devices and Materials, Kobe, 2005, pp. 188-189.

Hyoungsub Kim, et al., "Comparative Study on Electrical and Microstructural Characteristics of ZrO2 and HfO2 Grown by Atomic Layer Deposition", J. Mater. Res., vol. 20, No. 11, Nov. 2005, .COPYRGT. Material Research Society, pp. 3125-3132.

Y. Kuo, et al., "Sub 2 nm Thick Zirconium Doped Hafnium Oxide High-K Gate Dielectrics", 208th ECS Meeting (Oct. 19, 2005), Abstract #548, 1 page.

Tsunehiro Ino, et al., "Dielectric Constant Behavior of Oriented Tetragonal Zr—Si—O System", Extended Abstracts of the 2006 International Conference on Solid State Devices and Materials, Yokohama 2006, pp. 404-405.

Xinyuan Zhao, et al., "Phonons and Lattice Dielectric Properties of Zirconia", Physical Review B. vol. 65 (2002), pp. 075105-1-075105-10.

G. M. Rignanese, et al., "First-Principles Investigation of High-K Dielectrics: Comparison Between the Silicates and Oxides of Hafnium and Zirconium", Physical Review B 69, 2004, pp. 184301-1-184301-10.

H. Y. Yu, et al., "Physical and Electrical Characteristics of HfN Gate Electrode for Advanced MOS Devices", IEEE Electron Device Letters, vol. 24, No. 4, Apr. 2003, pp. 230-232.

Kamimuta et al., "Systematic Study of Vfb Shift in Stacked High-k Bi-layers with Cycle-by-Cycle ALD", Abstract, 7th International Conference on Atomic Layer Deposition, Jun. 24-27, 2007, San Diego, CA (1 pp).

U.S. Appl. No. 13/215,431, filed Aug. 23, 2011.

U.S. Appl. No. 13/363,765, filed Feb. 1, 2012.

U.S. Appl. No. 13/656,537, filed Oct. 19, 2012.

Choi et al. "Scaling equivalent oxide thickness with flat band voltage (Vfb) modulation using in situ Ti and Hf interposed in a metal/high-k gate stack," Journal of Applied Physics 108 (2010) pp. 064107-1-064107-4.

Ando et al. "Ultimate EOT Scaling (<5A) Using Hf-based High-k Gate Dielectrics and Impact on Carrier Mobility," ECS Transactions 28(1) (2010) pp. 115-123.

* cited by examiner

METHOD OF INTEGRATING BURIED THRESHOLD VOLTAGE ADJUSTMENT LAYERS FOR CMOS PROCESSING

FIELD OF INVENTION

The present invention relates to semiconductor devices, and more particularly to gate stacks having a gate electrode over a high-k gate dielectric, and methods of manufacturing the same.

BACKGROUND OF THE INVENTION

As the size and scaling of semiconductor device technology is reduced, aspects of device design and fabrication that previously gave rise to only second-order effects in long-channel devices can no longer be ignored. For example, the reduced scaling of channel length and gate oxide thickness in a conventional metal-oxide-semiconductor (MOS) transistor exacerbates problems of polysilicon gate depletion, high gate resistance, high gate tunneling leakage current and device (i.e., boron) penetration into the channel region of the device. As a result, CMOS technology is increasingly replacing silicon dioxide gate dielectrics and polysilicon gate conductors with high dielectric constant (high-k) gate dielectrics in combination with metal gate electrodes formed from a gate stack of polysilicon and one or more metal layers.

Scaling of the gate dielectric is a challenge in improving performance of advanced field effect transistors. A high-k gate dielectric provides a way of scaling down the effective oxide thickness (EOT) of the gate dielectric without an excessive increase in the gate leakage current. However, high-k gate dielectric materials are prone to catalyze oxidation of the underlying substrate because high-k gate dielectric materials react with oxygen that diffuses through the gate electrode or gate spacers. Regrowth of a silicon oxide interface layer between a silicon substrate and the high-k gate dielectric during high-temperature processing steps is a major obstacle to successful effective oxide thickness scaling. Particularly, typical stacks of a high-k gate dielectric and a metal gate are known to be susceptible to a high temperature anneal in an oxygen ambient. Such a high temperature anneal in oxygen ambient results in regrowth of the silicon oxide interface layer and produces instability of the threshold voltage and EOT of field effect transistors.

While high-k dielectrics in conjunction with low sheet resistance metal gate electrodes advantageously exhibit improved transistor performance, the use of new metal layer technologies can create new technical challenges. For example, to optimize drain current and device performance and reduce the voltage threshold Vt, the desired effective work function for negative channel metal-oxide-semiconductor (NMOS) and positive channel metal-oxide-semiconductor (PMOS)) gate electrodes must be near the conduction (or valence) band edge of silicon, meaning that the metals used in NMOS transistors should have effective work functions near 4.1 eV and metals used in PMOS transistors should have effective work functions near 5.2 eV. Since it is difficult to find a material that can have its work function adjusted once it is deposited, approaches for obtaining differentiated work functions have involved forming separate gate electrode layers, such as by removing a deposited first metal gate layer from the gate insulator to deposit a second metal gate layer having a different work function. Such processes can damage the gate insulator layer, leading to high leakage or reliability problems for the finally formed device. Another method for obtaining different work functions involves formation of two gate stacks of unbalanced height which can be a major challenge for the subsequent gate etch process.

Accordingly, a need exists for an improved integration of a metal gate electrode and very thin high-k gate dielectric materials in NMOS and PMOS devices having work functions that are set near the silicon band edges for low voltage thresholds and improved device performance. Further, the integration should reduce or eliminate any interface layer underneath the high-k gate dielectric to enable effective oxide thickness scaling.

SUMMARY OF THE INVENTION

A semiconductor device and method of forming is described. According to one embodiment of the invention, the method includes providing a substrate defined with a first device region and a second device region and having an interface layer on the first device region and on the second device region, depositing a first high-k film on the interface layer, and performing a heat-treatment to form a modified interface layer by diffusion of a metal element from the first high-k film into the interface layer. The interface layer may include an oxide or an oxynitride. The method further includes depositing a first threshold voltage adjustment layer on the first high-k film, removing the first threshold voltage adjustment layer from the second device region, and following the removing, depositing a second high-k film above the first high-k film. The method further includes depositing a gate electrode film on the second high-k film, defining a first gate stack in the first device region, the first gate stack containing the modified interface layer, the first high-k film, the first threshold voltage adjustment layer, the second high-k film, and the gate electrode film, and defining a second gate stack in the second device region, the second gate stack containing the modified interface layer, the first high-k film, the second high-k film, and the gate electrode film. According to one embodiment the method further includes, following the removing of the first threshold voltage adjustment layer from the second device region, depositing a second threshold voltage adjustment layer over the first high-k film, where the second threshold voltage adjustment layer abuts the second high-k film and the first threshold voltage adjustment layer in the first device region, and where the second threshold voltage adjustment layer abuts the second high-k film and the first high-k film in the second device region.

According to one embodiment, a semiconductor device in provided that contains a substrate defined with a first device region and a second device region, a first gate stack in the first device region, the first gate stack containing a modified interface layer, a first high-k film, a first threshold voltage adjustment layer, a second high-k film, and a gate electrode film, and a second gate stack in the second device region, the second gate stack containing the modified interface layer, the first high-k film, the second high-k film, and the gate electrode film, wherein the modified interface layer is positioned between the first high-k film and the substrate and the modified interface layer contains a metal element diffused from the first high-k film. According to one embodiment, the second gate stack further comprises a second threshold voltage adjustment layer positioned between the first high-k film and the second high-k film.

DETAILED DESCRIPTION OF SEVERAL EMBODIMENTS

Embodiments of the invention describe methods of integrating buried threshold voltage adjustment layers in CMOS processing and devices containing the same.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention. Similarly, for purposes of explanation, specific numbers, materials, and configurations are set forth herein in order to provide a thorough understanding of the invention. Furthermore, it is understood that the various embodiments shown in the figures are illustrative representations and are not drawn to scale.

Reference throughout this specification to "one embodiment" means that a particular feature, structure, material, or characteristic described in connection with the embodiment is included in at least one embodiment of the invention, but does not denote that it is present in every embodiment. Thus, the appearances of the phrase "in one embodiment" in various places throughout this specification is not necessarily referring to the same embodiment of the invention.

Figure 1A:
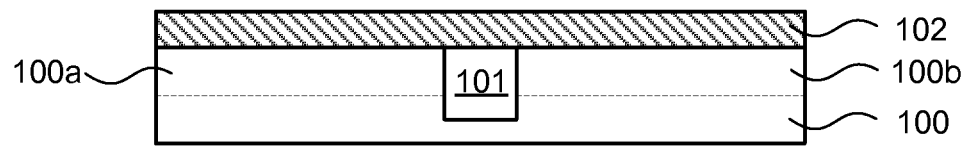
FIGS. 1A-1H show schematic cross-sectional views of a process flow for a gate integration scheme according to an embodiment of the invention.

FIGS. 1A-1G show schematic cross-sectional views of a process flow for a gate integration scheme according to an embodiment of the invention. FIG. 1A schematically shows a substrate 100 containing a first device region 100$a$ and a second device region 100$b$ that are separated by a shallow trench isolation (STI) 101. In one example, the first device region 100$a$ may be an NMOS device region and the second device region 100$b$ may be a PMOS device region. In another example, the first device region 100$a$ may be a PMOS device region and the second device region 100$b$ may be an NMOS device region. Depending on the type of device being fabricated, the substrate 100 and the regions 100$a$/100$b$ may contain bulk silicon substrate, single crystal silicon (doped or undoped), semiconductor on insulator (SOI) substrate, or any other semiconductor material including, for example, Si, SiC, SiGe, SiGeC, SnGe, Ge, GaAs, InAs, InGaAs, GaSb, InGaSb, InP, as well as other III/V or II/VI compound semiconductors or any combinations thereof. The substrate 100 can be of any size, for example a 200 mm substrate, a 300 mm substrate, or an even larger substrate. In one example, the substrate 100 can include a tensile-strained Si layer. According to another embodiment, the substrate 100 may contain Ge or $Si_xGe_{1-x}$ compounds, where x is the atomic fraction of Si, 1−x is the atomic fraction of Ge, and 0<1−x<1. Exemplary $Si_xGe_{1-x}$ compounds include $Si_{0.1}Ge_{0.9}$, $Si_{0.2}Ge_{0.8}$, $Si_{0.3}Ge_{0.7}$, $Si_{0.4}Ge_{0.6}$, $Si_{0.5}Ge_{0.5}$, $Si_{0.6}Ge_{0.4}$, $Si_{0.7}Ge_{0.3}$, $Si_{0.8}Ge_{0.2}$, and $Si_{0.9}Ge_{0.1}$. In one example, the substrate 100 can contain a compressive-strained Ge layer or a tensile-strained $Si_xGe_{1-x}$ (x>0.5) deposited on a relaxed $Si_{0.5}Ge_{0.5}$ buffer layer. In one example, the substrate 100 includes Si and a PMOS device region contains $Si_xGe_{1-x}$.

Figure 1B:
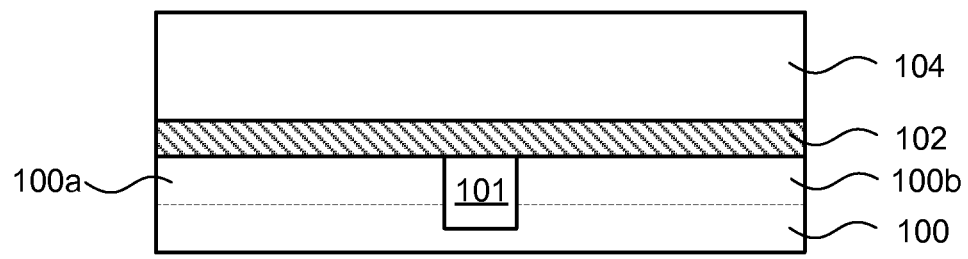

The STI 101 is formed to electrically isolate the first device region 100$a$ from the second device region 100$b$ and the STI 101 horizontally defines boundaries of the device regions 100$a$ and 100$b$. The STI 101 may be formed using conventional methods, for example by selectively etching an opening in the substrate 100 using a patterned mask or photoresist, depositing silicon oxide or silicon nitride to fill the opening, and then planarizing the oxide or nitride. The first device region 100$a$ may be doped with p-type dopants to form a NMOS device region and the second device region 100$b$ may be doped with n-type dopants to form a PMOS region. In another example, the first device region 100$a$ may be doped with n-type dopants to form a PMOS device region and the second device region 100$b$ may be doped with p-type dopants to form a NMOS region FIG. 1A further shows an interface layer 102 is formed on the first device region 100$a$ and the second device region 100$b$. The interface layer 102 can contain an oxide, a nitride, or an oxynitride, such as silicon oxide (e.g., $SiO_x$, where x is equal to or less than 2), silicon nitride, silicon oxynitride, or a combination thereof. In one example, the interface layer 102 can contain high mobility, low defect $SiO_2$. The interface layer 102 can have a thickness between about 5 angstrom and about 15 angstrom, between about 6 angstrom and about 10 angstrom, for example about 8 angstrom. The interface layer 102 may be formed on a clean substrate 100. Cleaning of the substrate 100 may be performed in a liquid bath containing dilute hydrofluoric acid (HF) or, alternatively, by HF gas phase etching. The dilute HF liquid solution can be a $H_2O$:HF (e.g., a 50:1) mixture. Following the HF cleaning process, the substrate 100 may be rinsed in de-ionized (D.I.) water. The interface layer 102 may contain a chemical oxide layer formed by oxidizing a surface of a monocrystalline silicon substrate 100 following removal of a native oxide layer. The chemical oxide layer may be formed in an aqueous bath containing deionized (DI) water and ozone ($O_3$), for example. The chemical oxide layer can be of high purity and can have a thickness between about 6 angstrom and about 15 angstrom. The chemical oxide layer passivates the underlying unoxidized portion of the monocrystalline silicon substrate 100 and forms a barrier to native oxide formation upon air exposure. Following formation of the chemical oxide layer, the substrate 100 is removed from the aqueous solution and dried, for example by a combination of isopropyl alcohol application and spin-drying. The presence of the chemical oxide layer on the substrate 100 limits buildup of atmospheric contaminants (e.g., organic contaminants) to the exposed surface of the chemical oxide layer upon transferring the substrate 100 from the aqueous solution to a vacuum processing tool for further processing. In one example, the substrate 100 may be cleaned by forming a chemical oxide layer on the substrate 100 as described above and thereafter the chemical oxide layer removed by a chemical oxide removal (COR) process or by vapor phase HF exposure. Subsequently a thin interface layer 102 may be formed in a vacuum processing tool. Alternatively, the COR process or the vapor phase HF exposure may also be performed in the vacuum processing tool. According to other embodiments, a clean substrate 100 may be transferred to the vacuum processing tool and the interface layer 102 formed in the vacuum processing tool FIG. 1B shows a first high-k film 104 deposited on the interface layer 102. The interface layer 102 has a lower dielectric constant than the first high-k film 104 and, therefore, the presence of the interface layer 102 increases the effective oxide thickness (EOT) of the combination of the interface layer 102 and the first high-k film 104. The first high-k film 104 can contain hafnium, zirconium, or hafnium and zirconium, including hafnium oxide (HfO$_2$), hafnium oxynitride (HfON), hafnium silicate (HfSiO), hafnium silicon oxynitride (HfSiON), zirconium oxide (ZrO$_2$), zirconium oxynitride (ZrON), zirconium silicate (ZrSiO), zirconium silicon oxynitride (ZrSiON), hafnium zirconium oxide (HfZrO), hafnium zirconium oxynitride (HfZrON), hafnium zirconium silicate (HfZrSiO), hafnium zirconium silicon oxynitride (HfZrSiON), or a combination of two or more thereof.

According to some embodiments, the first high-k film 104 can contain an oxide, oxynitride, or titanate layer containing one or more elements selected from Group II (beryllium (Be), magnesium (Mg), calcium (Ca), strontium (Sr), and barium (Ba)), Group III (scandium (Sc), yttrium (Y), and lanthanum (La)), Group IV (titanium (Ti), zirconium (Zr), and hafnium (Hf)), Group V (vanadium (V), niobium (Nb), tantalum (Ta)), Group XIII (boron (B), aluminum (Al), gallium (Ga), indium (In), and thallium (Tl)) and elements selected from rare earth metals of the Periodic Table of the Elements. Rare earth metals include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Examples of rare earth metal oxides include yttrium oxide (Y$_2$O$_3$), lanthanum oxide (La$_2$O$_3$) and lutetium oxide (Lu$_2$O$_3$). Examples of titanate layers include barium titanate (BaTiO$_3$), strontium titanate (SrTiO$_3$), hafnium titanate (HfTiO), zirconium titanate (ZrTiO), hafnium zirconium titanate (HfZrTiO), and barium strontium titanate (BaSrTiO$_3$).

According to embodiments of the invention, the first high-k film 104 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods. A thickness of the first high-k film 104 can, for example, be at least 2 Angstrom, between about 2 Angstrom and about 60 Angstrom, between about 5 Angstrom and about 30 Angstrom, or between about 5 Angstrom and about 15 Angstrom.

Figure 1C:
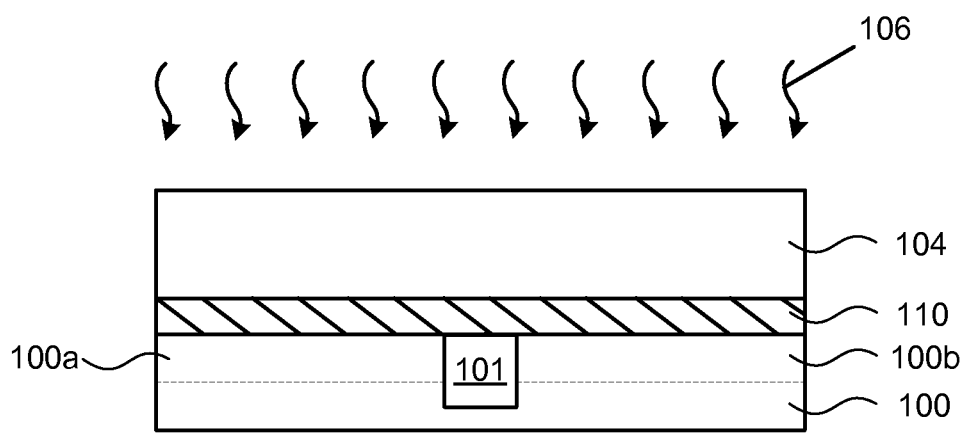

In FIG. 1C, arrows 106 represent heat-treating of the first high-k film 104 and interface layer 102. According to embodiments of the invention, the heat-treating includes heating the first high-k film 104 and the interface layer 102 at a temperature that forms a modified interface layer 110 depicted in FIG. 1C. The modified interface layer 110 can have an equivalent oxide thickness that is equal to or lower than the equivalent oxide thickness of the interface layer 102 shown in FIG. 1A. The heat-treating also improves the properties of the first high-k film 104, including improved etch resistance and densification of the first high-k film 104. The densification lowers the equivalent oxide thickness of the first high-k film 104. Further examples of lowering the equivalent oxide thickness of a film structure containing a high-k film are described in U.S. patent application Ser. No. 12/719,690, titled "METHOD FOR FORMING A HIGH-K GATE STACK WITH REDUCED EFFECTIVE OXIDE THICKNESS", the entire content of which is hereby incorporated by reference.

The heat-treating may be performed for a time period between about 10 seconds and 600 seconds, for example about 300 seconds. The heat-treating may be performed under substantially oxygen-free reduced pressure conditions with or without the use of an inert gas. In one example, the heat-treating may be performed in an inert atmosphere at a pressure less than 100 Torr with less than 0.1% O$_2$ gas in the inert atmosphere. In one example, the heat-treating may be performed at a pressure below 1 mTorr, below 0.1 mTorr, or below 0.01 mTorr, in the absence of an inert gas. When an inert gas is used, the inert gas may be selected from N$_2$ gas and the noble gases. Exemplary heat-treating conditions that use an inert gas may include an inert gas pressure in a range from about 1 mTorr to about 100 Torr, or in a range from about 100 mTorr to about 10 Torr. However, embodiments of the invention are not limited by these heat-treating conditions as other heat-treating conditions may be utilized.

In one example, the substrate 100 may contain monocrystalline silicon, the interface layer 102 may contain SiO$_2$, a rare earth-based first high-k film 104 may contain La$_2$O$_3$, and the heat-treating temperature may be equal to or greater than 900° C. It is to be understood, however, that the heat-treating temperature may be selected such that low EOT is achieved for a particular rare earth-based first high-k film 104 deposited on a particular interface layer 102.

Figure 1D:
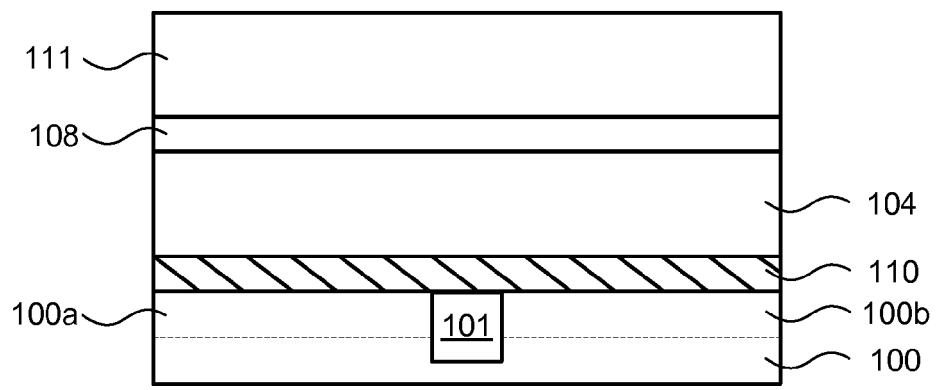

FIG. 1D shows a first threshold voltage adjustment layer 108 deposited on the first high-k film 104 over the first device region 100*a* and the second device region 100*b*. The first threshold voltage adjustment layer 108 may be used to control the work function of a gate stack and to obtain the desired threshold voltages for NMOS and PMOS transistors in a semiconductor device. The first threshold voltage adjustment layer 108 may contain a first metal element that can diffuse into the first high-k film 104 during a heat-treating process.

According to one embodiment of the invention, the first device region 100*a* can be an NMOS device region and the first threshold voltage adjustment layer 108 can include a first metal element is selected from Mg, Ca Sr, Ba, Sc, Y, La, V, Nb, Ta, Al, Ga, Ce, Pr, Nd, Pm, Sm, Eu, Gd, Tb, Dy, Ho, Er, Tm, Yb, or Lu, or a combination thereof. The first threshold voltage adjustment layer 108 can contain a metal oxide, a metal nitride, or a metal oxynitride, or a combination thereof. Examples of rare earth metal oxides include yttrium oxide (Y$_2$O$_3$), lanthanum oxide (La$_2$O$_3$) and lutetium oxide (Lu$_2$O$_3$). According to another embodiment of the invention, the first device region 100*a* can be a PMOS device region and the first threshold voltage adjustment layer 108 can include a metal or a metal-oxide layer containing a first metal element selected from Mg, Ca Sr, Ba, Sc, Y, La, V, Nb, Ta, Al, Ga, Ce, Pr, Nd, Pm, Sm, Eu, Gd, Tb, Dy, Ho, Er, Tm, Yb, or Lu, or a combination thereof.

The first threshold voltage adjustment layer 108 may be deposited by atomic layer deposition (ALD), plasma-enhanced ALD (PEALD), chemical vapor deposition (CVD), plasma-enhanced CVD (PECVD), or sputtering. A thickness of the first threshold voltage adjustment layer 108 can, for example, be between about 1 Angstrom and about 20 Angstrom, between about 3 Angstrom and about 6 Angstrom, between about 1 Angstrom and about 5 Angstrom, or between about 5 Angstrom and about 20 Angstrom. The thickness of the first threshold voltage adjustment layer 108 may be selected to provide an adequate supply of the first metal element for diffusion into the first high-k film 104 in the NMOS device region 100*a* to reach a targeted threshold voltage shift. In other words, the thicker the first threshold voltage adjustment layer 108, the greater the available supply of the first metal element.

FIG. 1D further shows a first barrier film 111 containing, for example, one or more of TiN, TiC, TiCN, TiAlN, TiSiN, TaN, TaC, TaCN, TaAlN, TaSiN, amorphous Si, SiN, or poly-Si, deposited on the first threshold voltage adjustment layer 108. A thickness of the first barrier film 111 can be between about 50 and 200 Angstrom, for example. The first barrier film 111 provides physical separation of the first threshold voltage adjustment layer 108 from any subsequent layers formed on the first barrier film 111, such as a mask layer and/or a photoresist. The first barrier film 111 can prevent or significantly reduce oxygen diffusion into the first threshold voltage adjustment layer 108 from a gaseous environment during heat-treating processes.

Figure 1E:
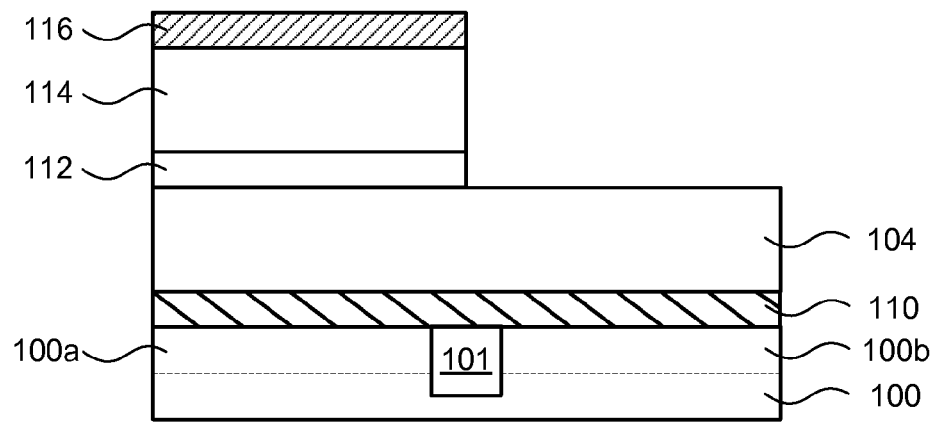

FIG. 1E shows a first threshold voltage adjustment layer 112 formed on the first high-k film 104 in the first device region 100a, a first barrier film 114 formed on the first threshold voltage adjustment layer 112, and patterned mask layer/photoresist 116. The patterned film structure in FIG. 1E may be formed by removing the first threshold voltage adjustment layer 108 and the first barrier film 111 in the second device region 100b by standard lithography and etching methods that utilize the patterned mask 116 formed over the first device region 100a. The pattern transfer may use one or more etching steps to remove the unprotected portions of the first barrier film 111 and the first threshold voltage adjustment layer 108 above the first high-k film 104 in the second device region 100b. The one or more etching steps can, for example, include plasma etching, reactive ion etching (RIE), or wet etching using an etchant species in liquid solution. The patterned mask 116 can contain photoresist. In some examples, the patterned mask 116 can contain an organic mask or silicon nitride (SiN). For example, a photolithography tool may be used to image a pattern onto a blanket photoresist material layer (not shown) deposited on the film structure in FIG. 1D.

In one example, the first barrier film 114 (e.g., TiN) and the first threshold voltage adjustment layer 112 may be anisotropically plasma etched with high etch selectivity to the first high-k film 104 using a chlorine-based process gas (e.g., $BCl_3/Cl_2/O_2/Ar$). However, low substrate temperatures (e.g., less than 200° C., for example around room temperature and below) are preferred since the high etch selectivity may be lost at temperatures above 200° C. due to increased volatility of the etch products at these temperatures. Similarly, a fluorine-based process gas (e.g., $CF_4/O_2$) may be used at temperatures above room temperature while maintaining high etch selectivity to the first high-k film 104.

Figure 1F:
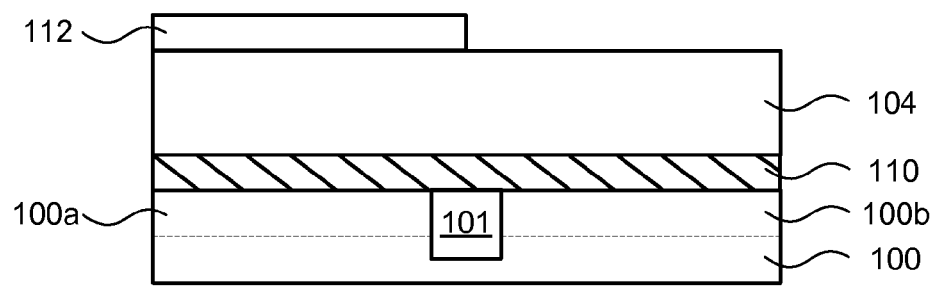

Following the anisotropic plasma etch, the patterned mask 116 is removed, for example, using a non-oxidizing ashing process or a wet etching process that avoids oxidizing the first barrier film 114 and the first threshold voltage adjustment layer 112. In one example, an organic mask may be removed in a plasma process using a process gas containing $N_2/H_2$. In some examples, the first barrier film 114 (e.g., TiN) and the patterned mask 116 may be selectively removed relative to the first high-k film 104 using a wet etching process utilizing a combination of $NH_4OH$ and HF. FIG. 1F shows the film structure following the removal of the patterned mask 116 and the first barrier film 114.

Figure 1G:
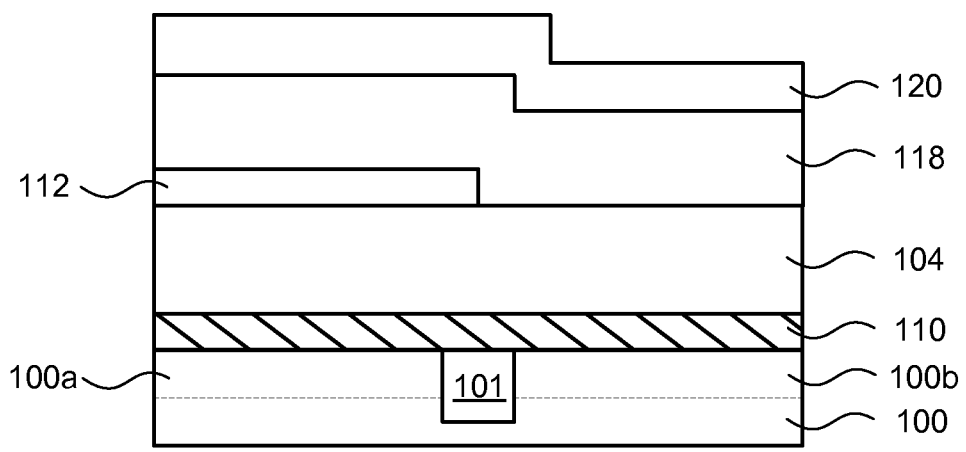

Thereafter, as depicted in FIG. 1G, a second high-k film 118 may be deposited over the first threshold voltage adjustment layer 112 in the first device region 100a and on the first high-k film 104 in the exposed second device region 100b. The second high-k film 118 may contain the same material as the first high-k film 104 but this is not required as the second high-k film 118 may contain a different material than the first high-k film.

The second high-k film 118 can contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof.

According to some embodiments, the second high-k film 118 can contain an oxide, oxynitride, or titanate layer containing one or more elements selected from Group II (beryllium (Be), magnesium (Mg), calcium (Ca), strontium (Sr), and barium (Ba)), Group III (scandium (Sc), yttrium (Y), and lanthanum (La)), Group IV (titanium (Ti), zirconium (Zr), and hafnium (Hf)), Group V (vanadium (V), niobium (Nb), and tantalum (Ta)), Group XIII (boron (B), aluminum (Al), gallium (Ga), indium (In), and thallium (Tl)) and elements selected from rare earth metals of the Periodic Table of the Elements. Rare earth metals include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Examples of rare earth metal oxides include yttrium oxide ($Y_2O_3$), lanthanium oxide ($La_2O_3$) and lutetium oxide ($Lu_2O_3$). Examples of titanate layers include barium titanate ($BaTiO_3$), strontium titanate ($SrTiO_3$), hafnium titanate (HfTiO), zirconium titanate (ZrTiO), hafnium zirconium titanate (HfZrTiO), and barium strontium titanate ($BaSrTiO_3$).

According to embodiments of the invention, the second high-k film 118 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods. A thickness of the second high-k film 118 can, for example, be at least 2 Angstrom, between about 2 Angstrom and about 60 Angstrom, between about 5 Angstrom and about 30 Angstrom, or between about 5 Angstrom and about 15 Angstrom.

From this point on, well-known processing schemes may be utilized. In one example, conventional gate first integration may be performed. A gate electrode film 120 may be deposited on the second high-k film 118. The gate electrode film 120 can, for example, have a thickness between about 5 nm (nanometers) and about 40 nm, or between about 5 nm and about 10 nm and can, for example, contain W, WN, $WSi_x$, Al, Mo, Ta, TaN, TaSiN, HfN, HfSiN, Ti, TiN, TiSiN, Mo, MoN, Re, Pt, Ru, or Si.

Figure 1H:
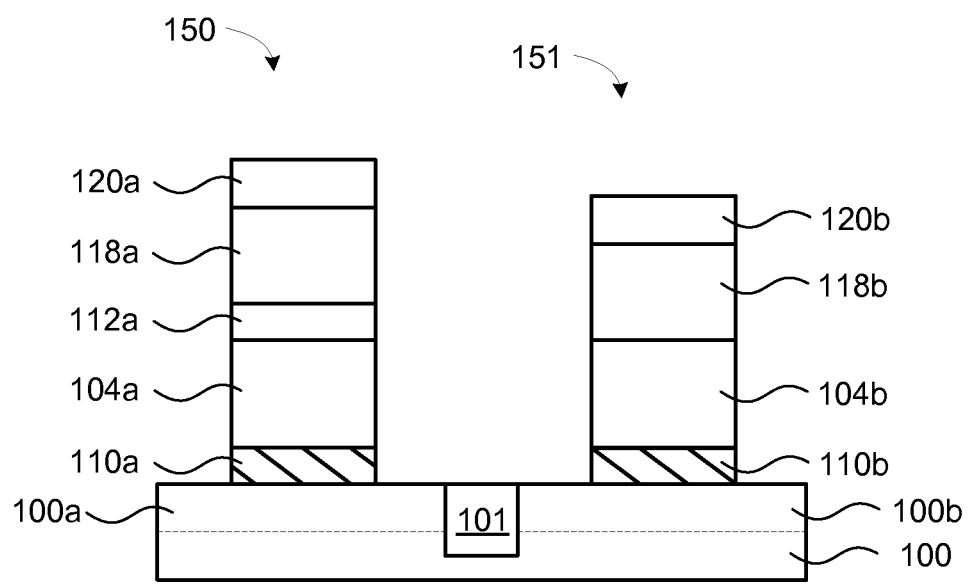

FIG. 1H shows gate structures 150 and 151 following a patterned etch of the film structure in FIG. 1G. The gate structure 150 above the first device region 100a includes first gate electrode 120a, second high-k film 118a, first threshold voltage adjustment layer 112a, first high-k film 104a, and modified interface layer 110a. The gate structure 151 above the second device region 100b includes second gate electrode 120b, second high-k film 118b, first high-k film 104b, and modified interface layer 110b.

According to some embodiments of the invention, a heat-treating process may be performed on one or more of the film structures depicted in FIG. 1F-1H to diffuse a first metal element from the first threshold voltage adjustment layer 112 or 112a into the first high-k film 104 in the first device region 100a. The heat-treating process may utilize a substrate temperature, time, and gaseous environment (e.g., an inert gaseous environment containing a noble gas or $N_2$), that results in a targeted diffusion of the first metal element (e.g., La or Ba) into the first high-k film 104 or the first high-k film 104a in the first device region 100a. For example, the heat treating process may include heating the substrate between about 300° C. and about 1000° C., between about 500° C. and about 850° C., between about 350° C. and about 850° C., between about 700° C. and about 1000° C., or between about 300° C. and about 550° C. In one example, the heat-treating may include a rapid thermal anneal (RTA), spike anneal, or laser spike anneal (LSA) with a fast positive temperature ramping rate to a target temperature between about 800° C. and 1200° C., in an inert gaseous atmosphere, followed by a hold at the target temperature, and subsequent rapid temperature ramp down. However, other target temperatures may be used, for example between about 900° C. and 1100° C., or between 1000° C. and 1200° C. In another example the heat treating process may include exposing the substrate to microwaves to heat the film structures.

Figure 2A:
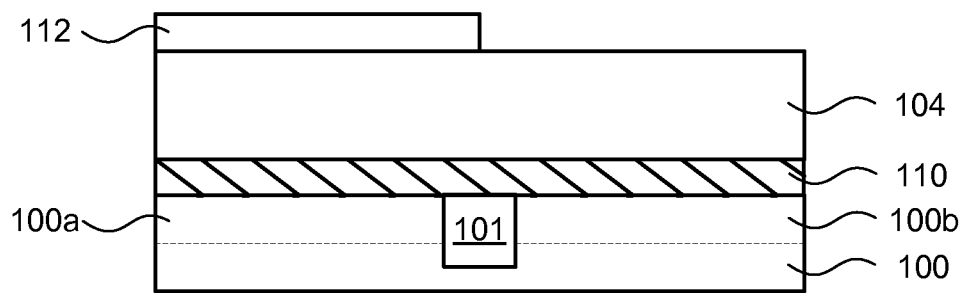
FIGS. 2A-2D show schematic cross-sectional views of a process flow for a gate integration scheme according to another embodiment of the invention.
Figure 2B:
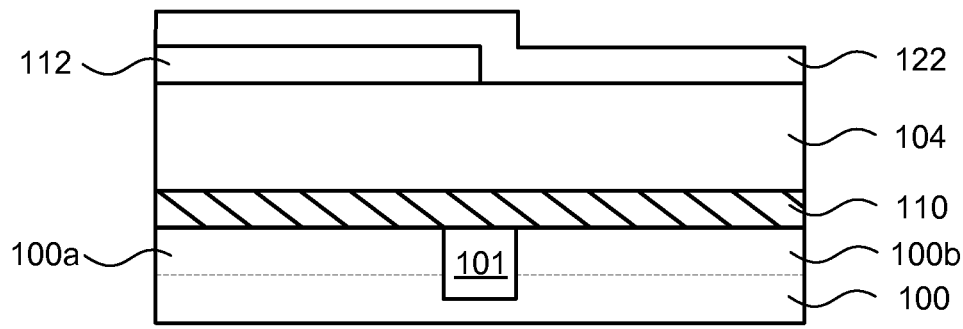

FIGS. 2A-2F show schematic cross-sectional views of a process flow for a gate integration scheme according to another embodiment of the invention. FIG. 2A shows a film structure that includes the features of FIG. 1F that have been described above. FIG. 2B schematically shows a second threshold voltage adjustment layer 122 deposited over the first threshold voltage adjustment layer 112 and on the first high-k film 104 in the second device region 100b. The second threshold voltage adjustment layer 122 may be used to control the work function of a gate stack and to obtain the desired threshold voltages for NMOS and PMOS transistors in a semiconductor device. According to embodiments of the invention, the second threshold voltage adjustment layer 122 has a different chemical composition than the first high-k film 104 and the first threshold voltage adjustment layer 112. The second threshold voltage adjustment layer 122 may contain a second metal element that can diffuse into the first high-k film 104 during a heat-treating process.

According to one embodiment of the invention, the second device region 100a can be a PMOS device region and the second threshold voltage adjustment layer 122 can include a metal or a metal-oxide layer containing a second metal element that is different from the first metal element of the first threshold voltage adjustment layer 108 and is selected from Ti, Ta, Al, Ga, Mg, Ca Sr, Ba, Sc, Y, La, V, Nb, Ta, In, Tl, Ce, Pr, Nd, Pm, Sm, Eu, Gd, Tb, Dy, Ho, Er, Tm, Yb, or Lu, or a combination thereof. According to another embodiment of the invention, the second device region 100a can be a NMOS device region and the second threshold voltage adjustment layer 122 can include a second metal element that is different from the first metal element of the first threshold voltage adjustment layer 108 and is selected from Ti, Ta, Al, Ga, Mg, Ca Sr, Ba, Sc, Y, La, V, Nb, Ta, In, Tl, Ce, Pr, Nd, Pm, Sm, Eu, Gd, Tb, Dy, Ho, Er, Tm, Yb, or Lu, or a combination thereof.

The second threshold voltage adjustment layer 122 may be deposited by atomic layer deposition (ALD), plasma-enhanced ALD (PEALD), chemical vapor deposition (CVD), plasma-enhanced CVD (PECVD), or sputtering. A thickness of the second threshold voltage adjustment layer 122 can, for example, be between about 5 Angstrom and about 200 Angstrom, between about 10 Angstrom and about 30 Angstrom, between about 30 Angstrom and about 200 Angstrom, or between about 200 Angstrom and about 200 Angstrom. The thickness of the second threshold voltage adjustment layer 122 may selected to provide an adequate supply of the second metal element for diffusion into the first high-k film 104 in the second device region 100b to reach a targeted threshold voltage shift. In other words, the thicker the second threshold voltage adjustment layer, the greater the available supply of the second metal element.

Figure 2C:
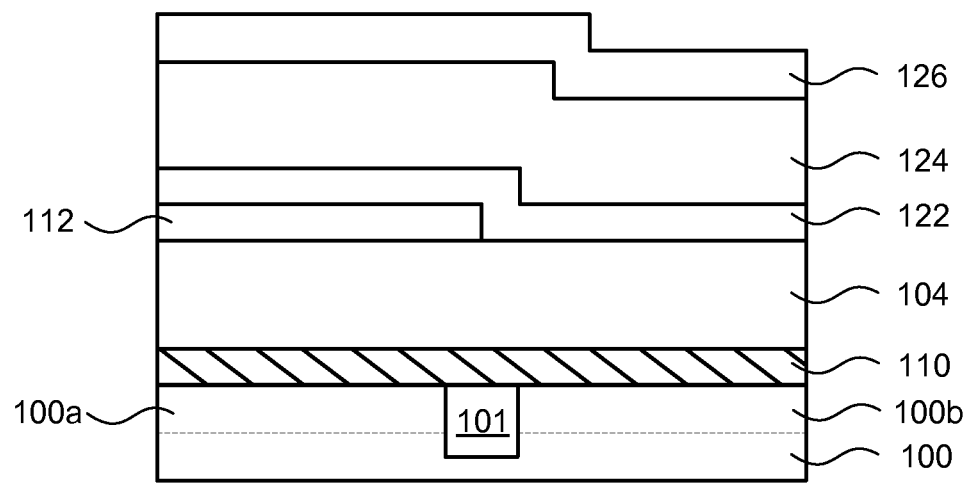

As depicted in FIG. 2C, a second high-k film 124 is deposited over the second threshold voltage adjustment layer 122. The second high-k film 124 can contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof.

According to some embodiments, the second high-k film 124 can contain an oxide, oxynitride, or titanate layer containing one or more elements selected from Group II (beryllium (Be), magnesium (Mg), calcium (Ca), strontium (Sr), and barium (Ba)), Group III (scandium (Sc), yttrium (Y), and lanthanum (La)), Group IV (titanium (Ti), zirconium (Zr), and hafnium (Hf)), Group V (vanadium (V), niobium (Nb), and tantalum (Ta)), Group XIII (boron (B), aluminum (Al), gallium (Ga), indium (In), and thallium (Tl)) and elements selected from rare earth metals of the Periodic Table of the Elements. Rare earth metals include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Examples of rare earth metal oxides include yttrium oxide ($Y_2O_3$), lanthanium oxide ($La_2O_3$) and lutetium oxide ($Lu_2O_3$). Examples of titanate layers include barium titanate ($BaTiO_3$), strontium titanate ($SrTiO_3$), hafnium titanate (HfTiO), zirconium titanate (ZrTiO), hafnium zirconium titanate (HfZrTiO), and barium strontium titanate ($BaSrTiO_3$).

According to embodiments of the invention, the second high-k film 124 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods. A thickness of the second high-k film 124 can, for example, be at least 2 Angstrom, between about 2 Angstrom and about 60 Angstrom, between about 5 Angstrom and about 30 Angstrom, or between about 5 Angstrom and about 15 Angstrom.

As further shown in FIG. 2C, a gate electrode film 126 is deposited on the second high-k film 124. The gate electrode film 126 can, for example, have a thickness between about 5 nm (nanometers) and about 40 nm, or between about 5 nm and about 10 nm and can, for example, contain W, WN, $WSi_x$, Al, Mo, Ta, TaN, TaSiN, HfN, HfSiN, Ti, TiN, TiSiN, Mo, MoN, Re, Pt, Ru, or Si.

Figure 2D:
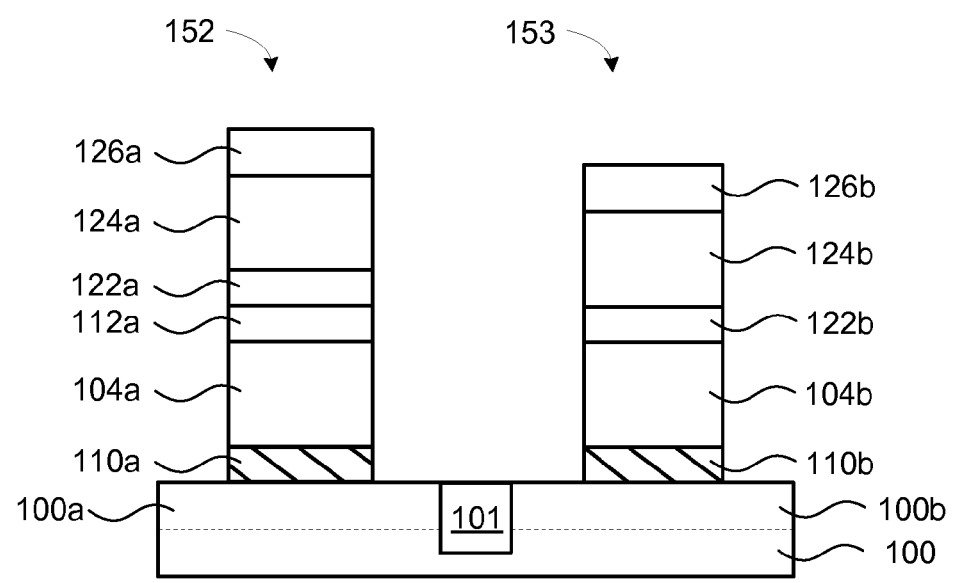

FIG. 2D shows gate structures 152 and 153 following a patterned etch of the film structure in FIG. 2C. The gate structure 152 above the first device region 100a includes gate electrode 126a, second high-k film 124a, second threshold voltage adjustment layer 122a, first threshold voltage adjustment layer 112a, first high-k film 104a, and modified interface layer 110a. The gate structure 153 above the second device region 100b includes gate electrode 126b, second high-k film 124b, second threshold voltage adjustment layer 122b, first high-k film 104b, and modified interface layer 110b.

According to some embodiments of the invention, a heat-treating process may be performed on the film structure depicted in FIG. 2A to diffuse a first metal element from the first threshold voltage adjustment layer 112 into the first high-k film 104 in the first device region 100a. Alternatively, or additionally, a heat-treating process may be performed on one or more of the film structures depicted in FIGS. 2B-2D to diffuse a first metal element from the first threshold voltage adjustment layer 112 or 112a into the first high-k film 104 in the first device region 100a and to diffuse a second metal element from the second threshold voltage adjustment layer 122 or 122b into the first high-k film 104 in the second device region 100b. The heat-treating process may utilize a substrate temperature, time, and gaseous environment (e.g., an inert gaseous environment containing a noble gas or $N_2$), that results in a targeted diffusion of the first metal element (e.g., La or Ba) into the first high-k film 104 in the first device region 100a, and diffusion of the second metal element (e.g., Al) into the first high-k film 104 in the second device region 100b. For example the heat treating process may include heating the substrate between about 300° C. and about 1000° C., between about 500° C. and about 850° C., between about 350° C. and about 850° C., between about 700° C. and about 1000° C., or between about 300° C. and about 550° C. In one example, the heat-treating may include a rapid thermal anneal (RTA), spike anneal, or laser spike anneal (LSA) with a fast positive temperature ramping rate to a target temperature between about 800° C. and 1200° C., in an inert gaseous atmosphere, followed by a hold at the target temperature, and subsequent rapid temperature ramp down. However, other target temperatures may be used, for example between about 900° C. and 1100° C., or between 1000° C. and 1200° C. In another example the heat treating process may include exposing the substrate to microwaves to heat the film structures.

Figure 3A:
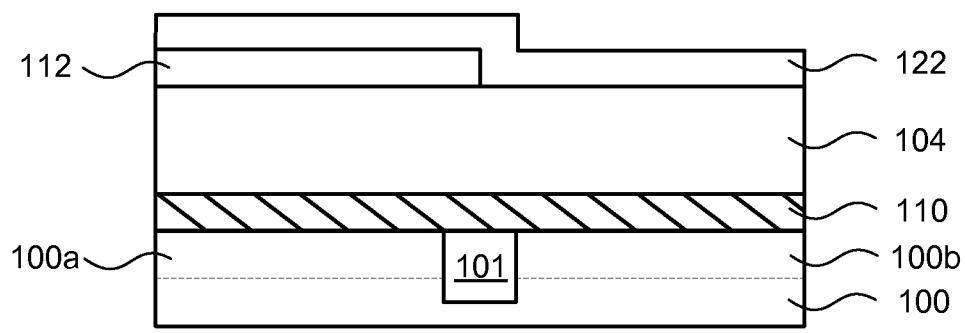
FIGS. 3A-3D show schematic cross-sectional views of a process flow for a gate integration scheme according to another embodiment of the invention.

FIGS. 3A-3F show schematic cross-sectional views of a process flow for a gate integration scheme according to another embodiment of the invention. FIG. 3A shows a film structure that includes the features of FIG. 2B that have been described above FIG. 3B shows a second threshold voltage adjustment layer 134 that is formed on the first high-k film 104 in the second device region 100a and on the first threshold voltage adjustment layer 112 that is formed on the first high-k film 104 in the first device region 100a. The structure shown in FIG. 3B may be formed by standard lithography and etching methods using a patterned mask and a barrier film in the second device region 100b, where the second threshold voltage adjustment layer 122 is removed in the first device region 100a. Exemplary lithography and etching methods were described above in reference to FIG. 1E.

Figure 3B:
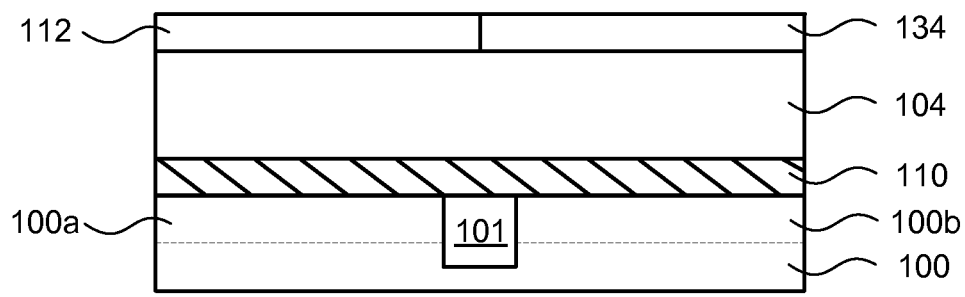
Figure 3C:
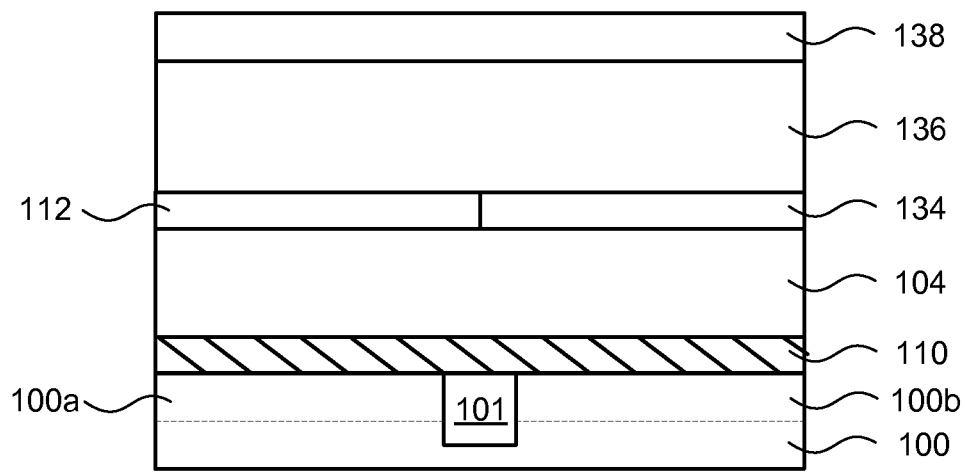

FIG. 3C shows a second high-k film 136 deposited over the first threshold voltage adjustment layer 112 and over the second threshold voltage adjustment layer 134. The second high-k film 136 can contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof.

According to some embodiments, the second high-k film 136 can contain an oxide, oxynitride, or titanate layer containing one or more elements selected from Group II (beryllium (Be), magnesium (Mg), calcium (Ca), strontium (Sr), and barium (Ba)), Group III (scandium (Sc), yttrium (Y), and lanthanum (La)), Group IV (titanium (Ti), zirconium (Zr), and hafnium (Hf)), Group V (vanadium (V), niobium (Nb), and tantalum (Ta)), Group XIII (boron (B), aluminum (Al), gallium (Ga), indium (In), and thallium (Tl)) and elements selected from rare earth metals of the Periodic Table of the Elements. Rare earth metals include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Examples of rare earth metal oxides include yttrium oxide ($Y_2O_3$), lanthanium oxide ($La_2O_3$) and lutetium oxide ($Lu_2O_3$). Examples of titanate layers include barium titanate ($BaTiO_3$), strontium titanate ($SrTiO_3$), hafnium titanate (HfTiO), zirconium titanate (ZrTiO), hafnium zirconium titanate (HfZrTiO), and barium strontium titanate ($BaSrTiO_3$).

According to embodiments of the invention, the second high-k film 136 may be deposited by atomic layer deposition (ALD), plasma-enhanced ALD (PEALD), chemical vapor deposition (CVD), or plasma-enhanced CVD (PECVD). According to one embodiment of the invention, ALD or PEALD may be utilized due to normally superior uniformity and atomic level thickness control compared to CVD and PECVD methods. A thickness of the second high-k film 136 can, for example, be at least 2 Angstrom, between about 2 Angstrom and about 60 Angstrom, between about 5 Angstrom and about 30 Angstrom, or between about 5 Angstrom and about 15 Angstrom.

FIG. 3C further shows a gate electrode film 138 that is deposited on the second high-k film 136. The gate electrode film 138 can, for example, have a thickness between about 5 nm (nanometers) and about 40 nm, or between about 5 nm and about 10 nm and can, for example, contain W, WN, $WSi_x$, Al, Mo, Ta, TaN, TaSiN, HfN, HfSiN, Ti, TiN, TiSiN, Mo, MoN, Re, Pt, Ru, or Si.

Figure 3D:
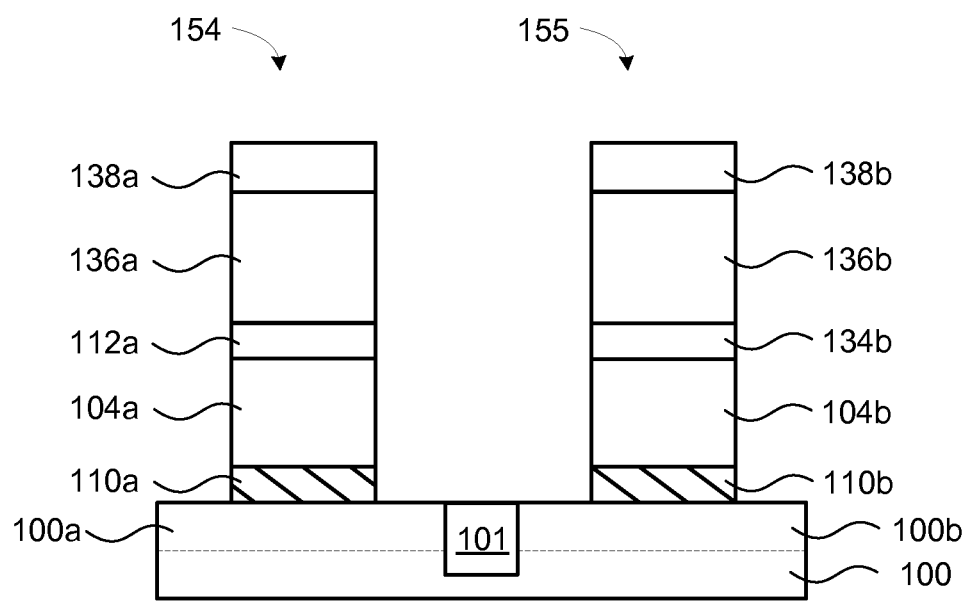

FIG. 3D shows gate structures 154 and 155 following a patterned etch of the film structure in FIG. 3C. The gate structure 154 and 155 above the first device region 100a includes gate electrode 138a, second high-k film 136a, first threshold voltage adjustment layer 112a, first high-k film 104a, and modified interface layer 110a. The gate structure 155 above the second device region 100b includes gate electrode 138b, second high-k film 136b, second threshold voltage adjustment layer 134b, first high-k film 104b, and modified interface layer 110b.

According to some embodiments of the invention, a heat-treating process may be performed on one or more of the film structures depicted in FIGS. 3B-3D to diffuse a first metal element from the first threshold voltage adjustment layer 112 or 112a into the first high-k film 104 in the first device region 100a and to diffuse a second metal element from the second threshold voltage adjustment layer 134 or 134b into the first high-k film 104 in the second device region 100b. The heat-treating process may utilize a substrate temperature, time, and gaseous environment (e.g., an inert gaseous environment containing a noble gas or $N_2$), that results in a targeted diffusion of a first metal element (e.g., La or Ba) into the first high-k film 104 in the first device region 100a, and diffusion of a second metal element (e.g., Al) into the first high-k film 104 in the second device region 100b. In one example, the heat-treating may include a rapid thermal anneal (RTA) with a fast positive temperature ramping rate to a target temperature between about 800° C. and 1200° C., in an inert gaseous atmosphere, followed by a hold at the target temperature, and subsequent rapid temperature ramp down. However, other target temperatures may be used, for example between about 900° C. and 1100° C., or between 1000° C. and 1200° C.

The embodiments above describe gate first integration schemes for forming a planar semiconductor device. However, embodiments of the invention may also be applied to non-planar semiconductor devices, for example FinFET's or tri-gate transistors.

Figure 4A:
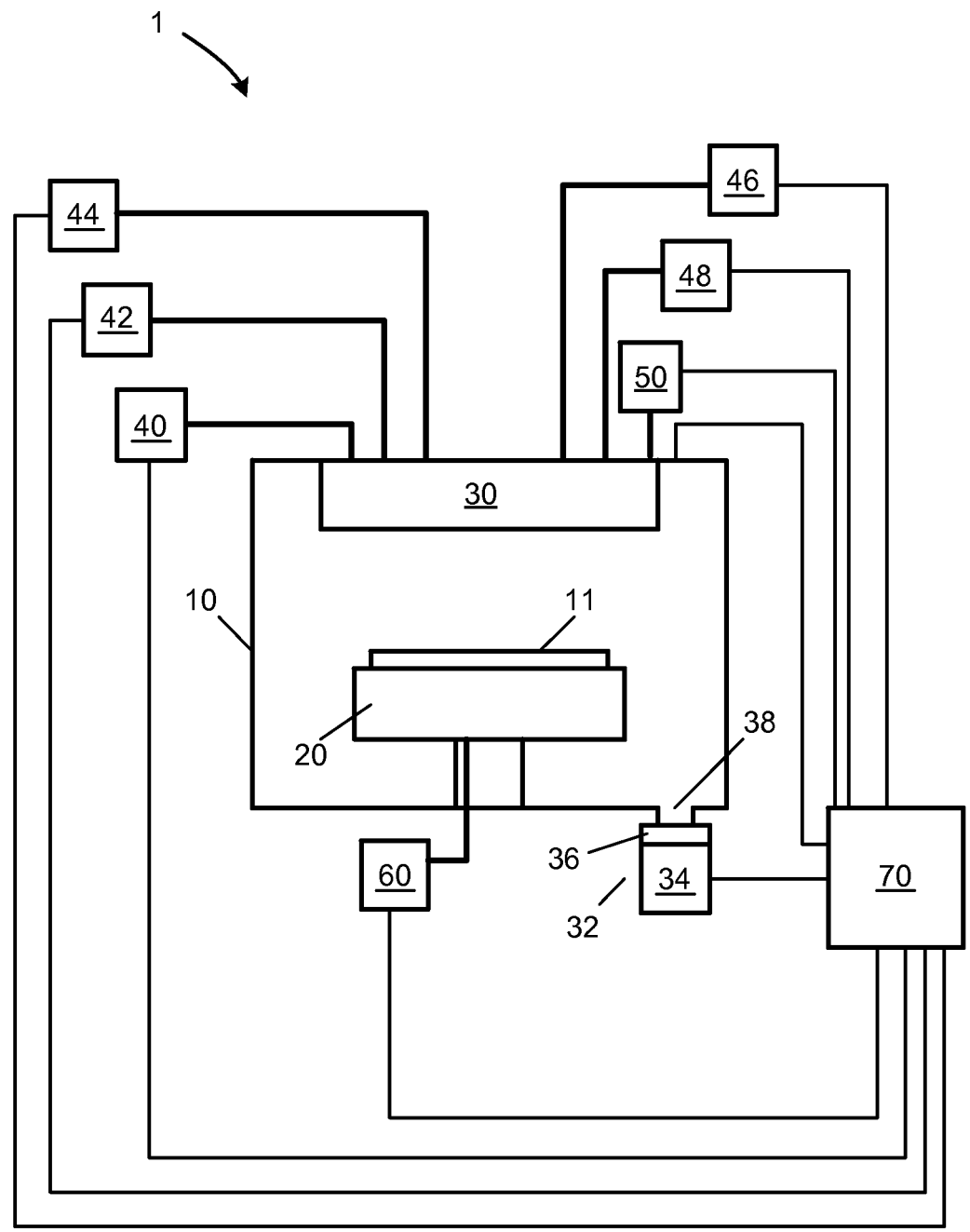
FIGS. 4A and 4B illustrate processing systems for depositing films and layers on a substrate according to embodiments of the invention.

FIG. 4A illustrates a processing system 1 that may be utilized for depositing one or more of the films and layers described above, including high-k films and threshold voltage adjustment layers according to one embodiment of the invention. The processing system 1 may be configured for performing ALD or CVD processing. The processing system 1 includes a process chamber 10 having a substrate holder 20 configured to support a substrate 100, upon which the film or layer is formed. The process chamber 10 further contains an upper assembly 30 (e.g., a showerhead) coupled to a first precursor supply system 40 (e.g., hafnium precursor supply system), a second precursor supply system 42 (e.g., lanthanum or aluminum precursor supply system), a purge gas supply system 44, an oxygen-containing gas supply system 46, a nitrogen-containing gas supply system 48, and an auxiliary gas supply system 50 for supplying one or more elements selected from Mg, Ca, Sr, Ba Sc, Y, La, Ce, Pr, Nd, Pm, Sm, Eu, Gd, Tb, Dy, Ho, Er, Tm, Yb, or Lu, or a combination thereof, or other elements, for example silicon. In addition, the oxygen-containing gas supply system 46 or the nitrogen-containing gas supply system 48 may be configured to supply an oxygen-containing gas and nitrogen-containing gas, respectively. Additionally, processing system 1 includes a substrate temperature control system 60 coupled to substrate holder 20 and configured to elevate and control the temperature of substrate 100. Furthermore, the processing system 1 includes a controller 70 that can be coupled to process chamber 10, substrate holder 20, upper assembly 30 configured for introducing process gases into the process chamber 10, first precursor supply system 40, second precursor supply system 42, purge gas supply system 44, oxygen-containing gas supply system 46, nitrogen-containing gas supply system 48, auxiliary gas supply system 50, and substrate temperature control system 60.

Alternatively, or in addition, controller 70 can be coupled to one or more additional controllers/computers (not shown), and controller 70 can obtain setup and/or configuration information from an additional controller/computer.

In FIG. 4A, singular processing elements (10, 20, 30, 40, 42, 44, 46, 48, 50, and 60) are shown, but this is not required for the invention. The processing system 1 can include any number of processing elements having any number of controllers associated with them in addition to independent processing elements. The controller 70 can be used to configure any number of processing elements (10, 20, 30, 40, 42, 44, 46, 48, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Still referring to FIG. 4A, the processing system 1 may be configured to process 200 mm substrates, 300 mm substrates, or larger-sized substrates. In fact, it is contemplated that the processing system 1 may be configured to process substrates or wafers regardless of their size, as would be appreciated by those skilled in the art. Therefore, while aspects of the invention will be described in connection with the processing of a semiconductor substrate, the invention is not limited solely thereto. Alternately, a batch processing system capable of processing multiple substrates simultaneously may be utilized for depositing the films or layers described in the embodiments of the invention.

The first precursor supply system 40 and the second precursor supply system 42 may be configured to alternately or simultaneously introduce a first precursor and a second precursor to process chamber 10. The alternation of the introduction of the first and second precursors can be cyclical, or it may be acyclical with variable time periods between introduction of the first and second precursors.

According to embodiments of the invention, several methods may be utilized for introducing the first and/or second precursors to the process chamber 10. One method includes vaporizing precursors through the use of separate bubblers or direct liquid injection (DLI) systems, or a combination thereof, and then mixing in the gas phase within or prior to introduction into the process chamber 10. DLI systems have been shown to reduce premature thermal decomposition of precursors over bubbling methods. By controlling the vaporization rate of each precursor separately, a desired stoichiometry can be attained within the deposited film. Another method of delivering the first and second precursors includes separately controlling two or more different liquid sources (neat precursors or precursor solutions), which are then mixed prior to entering a common vaporizer. This method may be utilized when the precursors are compatible in solution or in liquid form and they have similar vaporization characteristics. Yet another method of delivering the first and second precursor includes controlling the flow of a liquid precursor mixture (neat precursors or precursor solutions) to a common vaporizer. Other methods include the use of compatible mixed solid or liquid precursors within a bubbler. Liquid source precursors may include neat liquid precursors, or solid or liquid precursors that are dissolved in a compatible solvent. Possible compatible solvents include, but are not limited to, ionic liquids, hydrocarbons (aliphatic, olefins, and aromatic), amines, esters, glymes, crown ethers, ethers and polyethers. In some cases it may be possible to dissolve one or more compatible solid precursors in one or more compatible liquid precursors. It will be apparent to one skilled in the art that by controlling the relative concentration levels of the first and second precursors within a gas pulse, it is possible to deposit films with desired stoichiometries. In one example, hafnium zirconium based films can contain between 5 and 95 atomic percent zirconium (5%<% Zr/(% Zr+% Hf)<95%), and between 5 and 95 atomic percent hafnium (5%<% Hf/(% Zr+% Hf)<95%).

Embodiments of the invention may utilize a wide variety of hafnium and zirconium precursors. For example, representative examples include: Hf(O$^t$Bu)$_4$ (hafnium tert-butoxide, HTB), Hf(NEt$_2$)$_4$ (tetrakis(diethylamido)hafnium, TDEAH), Hf(NEtMe)$_4$ (tetrakis(ethylmethylamido)hafnium, TEMAH), Hf(NMe$_2$)$_4$ (tetrakis(dimethylamido)hafnium, TDMAH), Zr(O$^t$Bu)$_4$ (zirconium tert-butoxide, ZTB), Zr(NEt$_2$)$_4$ (tetrakis(diethylamido)zirconium, TDEAZ), Zr(NMeEt)$_4$ (tetrakis(ethylmethylamido)zirconium, TEMAZ), Zr(NMe$_2$)$_4$ (tetrakis(dimethylamido)zirconium, TDMAZ), Hf(mmp)$_4$, Zr(mmp)$_4$, HfCl$_4$, ZrCl$_4$, ZrCp$_2$Me$_2$, Zr(tBuCp)$_2$Me$_2$, and Zr(NiPr$_2$)$_4$. In one example, the hafnium and zirconium precursors may have the same ligands (e.g., HTB and ZTB), thereby preventing any possible detrimental ligand exchange between the precursors.

Embodiments of the invention may utilize one or more of a wide variety of different elements selected from Group II, Group III, Group XIII, and rare earth metals of the Periodic Table. The elements may be provided using any precursor gases that have sufficient reactivity, thermal stability, and volatility. The precursor gases may be delivered to the process chamber using bubbling or DLI methods described above for hafnium and zirconium precursors.

Embodiments of the inventions may utilize a wide variety of different rare earth precursors. For example, many rare earth precursors have the formula:

$$ML^1L^2L^3D_x$$

where M is a rare earth metal element selected from the group of yttrium (Y), lutetium (Lu), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), and ytterbium (Yb). $L^1$, $L^2$, $L^3$ are individual anionic ligands, and D is a neutral donor ligand where x can be 0, 1, 2, or 3. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclopentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis (trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentandionate, and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6,10-Crown-4, pyridine, N-methylpyrrolidine, triethylamine, trimethylamine, acetonitrile, and 2,2-dimethylpropionitrile.

Representative examples of rare earth precursors include:
Y precursors: $Y(N(SiMe_3)_2)_3$, $Y(N(iPr)_2)_3$, $Y(N(tBu)SiMe_3)_3$, $Y(TMPD)_3$, $Cp_3Y$, $(MeCp)_3Y$, $((nPr)Cp)_3Y$, $((nBu)Cp)_3Y$, $Y(OCMe_2CH_2NMe_2)_3$, $Y(THD)_3$, $Y[OOCCH(C_2H_5)C_4H_9]_3$, $Y(C_{11}H_{19}O_2)_3CH_3(OCH_2CH_2)_3OCH_3$, $Y(CF_3COCHCOCF_3)_3$, $Y(OOCC_{10}H_7)_3$, $Y(OOC_{10}H_{19})_3$, and $Y(O(iPr))_3$.

La precursors: $La(N(SiMe_3)_2)_3$, $La(N(iPr)_2)_3$, $La(N(tBu)SiMe_3)_3$, $La(TMPD)_3$, $((iPr)Cp)_3La$, $Cp_3La$, $Cp_3La(NCCH_3)_2$, $La(Me_2NC_2H_4Cp)_3$, $La(THD)_3$, $La[OOCCH(C_2H_5)C_4H_9]_3$, $La(C_{11}H_{19}O_2)_3.CH_3(OCH_2CH_2)_3OCH_3$, $La(C_{11}H_{19}O_2)_3.CH_3(OCH_2CH_2)_4OCH_3$, $La(O(iPr))_3$, $La(OEt)_3$, $La(acac)_3$, $La(((tBu)_2N)_2CMe)_3$, $La(((iPr)_2N)_2CMe)_3$, $La(((tBu)_2N)_2C(tBu))_3$, $La(((iPr)_2N)_2C(tBu))_3$, and $La(FOD)_3$.

Ce precursors: $Ce(N(SiMe_3)_2)_3$, $Ce(N(iPr)_2)_3$, $Ce(N(tBu)SiMe_3)_3$, $Ce(TMPD)_3$, $Ce(FOD)_3$, $((iPr)Cp)_3Ce$, $Cp_3Ce$, $Ce(Me_4Cp)_3$, $Ce(OCMe_2CH_2NMe_2)_3$, $Ce(THD)_3$, $Ce[OOCCH(C_2H_5)C_4H_9]_3$, $Ce(C_{11}H_{19}O_2)_3.CH_3(OCH_2CH_2)_3OCH_3$, $Ce(C_{11}H_{19}O_2)_3.CH_3(OCH_2CH_2)_4OCH_3$, $Ce(O(iPr))_3$, and $Ce(acac)_3$.

Pr precursors: $Pr(N(SiMe_3)_2)_3$, $((iPr)Cp)_3Pr$, $Cp_3Pr$, $Pr(THD)_3$, $Pr(FOD)_3$, $(C_5Me_4H)_3Pr$, $Pr[OOCCH(C_2H_5)C_4H_9]_3$, $Pr(C_{11}H_{19}O_2)_3.CH_3(OCH_2CH_2)_3OCH_3$, $Pr(O(iPr))_3$, $Pr(acac)_3$, $Pr(hfac)_3$, $Pr(((tBu)_2N)_2CMe)_3$, $Pr(((iPr)_2N)_2CMe)_3$, $Pr(((tBu)_2N)_2C(tBu))_3$, and $Pr(((iPr)_2N)_2C(tBu))_3$.

Nd precursors: $Nd(N(SiMe_3)_2)_3$, $Nd(N(iPr)_2)_3$, $((iPr)Cp)_3Nd$, $Cp_3Nd$, $(C_5Me_4H)_3Nd$, $Nd(THD)_3$, $Nd[OOCCH(C_2H_5)C_4H_9]_3$, $Nd(O(iPr))_3$, $Nd(acac)_3$, $Nd(hfac)_3$, $Nd(F_3CC(O)CHC(O)CH_3)_3$, and $Nd(FOD)_3$.

Sm precursors: $Sm(N(SiMe_3)_2)_3$, $((iPr)Cp)_3Sm$, $Cp_3Sm$, $Sm(THD)_3$, $Sm[OOCCH(C_2H_5)C_4H_9]_3$, $Sm(O(iPr))_3$, $Sm(acac)_3$, and $(C_5Me_5)_2Sm$.

Eu precursors: $Eu(N(SiMe_3)_2)_3$, $((iPr)Cp)_3Eu$, $Cp_3Eu$, $(Me_4Cp)_3Eu$, $Eu(THD)_3$, $Eu[OOCCH(C_2H_5)C_4H_9]_3$, $Eu(O(iPr))_3$, $Eu(acac)_3$, and $(C_5Me_5)_2Eu$.

Gd precursors: $Gd(N(SiMe_3)_2)_3$, $((iPr)Cp)_3Gd$, $Cp_3Gd$, $Gd(THD)_3$, $Gd[OOCCH(C_2H_5)C_4H_9]_3$, $Gd(O(iPr))_3$, and $Gd(acac)_3$.

Tb precursors: $Tb(N(SiMe_3)_2)_3$, $((iPr)Cp)_3Tb$, $Cp_3Tb$, $Tb(THD)_3$, $Tb[OOCCH(C_2H_5)C_4H_9]_3$, $Tb(O(iPr))_3$, and $Tb(acac)_3$.

Dy precursors: $Dy(N(SiMe_3)_2)_3$, $((iPr)Cp)_3Dy$, $Cp_3Dy$, $Dy(THD)_3$, $Dy[OOCCH(C_2H_5)C_4H_9]_3$, $Dy(O(iPr))_3$, $Dy(O_2C(CH_2)_6CH_3)_3$, and $Dy(acac)_3$.

Ho precursors: $Ho(N(SiMe_3)_2)_3$, $((iPr)Cp)_3Ho$, $Cp_3Ho$, $Ho(THD)_3$, $Ho[OOCCH(C_2H_5)C_4H_9]_3$, $Ho(O(iPr))_3$, and $Ho(acac)_3$.

Er precursors: $Er(N(SiMe_3)_2)_3$, $((iPr)Cp)_3Er$, $((nBu)Cp)_3Er$, $Cp_3Er$, $Er(THD)_3$, $Er[OOCCH(C_2H_5)C_4H_9]_3$, $Er(O(iPr))_3$, and $Er(acac)_3$.

Tm precursors: $Tm(N(SiMe_3)_2)_3$, $((iPr)Cp)_3Tm$, $Cp_3Tm$, $Tm(THD)_3$, $Tm[OOCCH(C_2H_5)C_4H_9]_3$, $Tm(O(iPr))_3$, and $Tm(acac)_3$.

Yb precursors: $Yb(N(SiMe_3)_2)_3$, $Yb(N(iPr)_2)_3$, $((iPr)Cp)_3Yb$, $Cp_3Yb$, $Yb(THD)_3$, $Yb[OOCCH(C_2H_5)C_4H_9]_3$, $Yb(O(iPr))_3$, $Yb(acac)_3$, $(C_5Me_5)_2Yb$, $Yb(hfac)_3$, and $Yb(FOD)_3$.

Lu precursors: $Lu(N(SiMe_3)_2)_3$, $((iPr)Cp)_3Lu$, $Cp_3Lu$, $Lu(THD)_3$, $Lu[OOCCH(C_2H_5)C_4H_9]_3$, $Lu(O(iPr))_3$, and $Lu(acac)_3$.

In the above precursors, as well as precursors set forth below, the following common abbreviations are used: Si: silicon; Me: methyl; Et: ethyl; iPr: isopropyl; nPr: n-propyl; Bu: butyl; nBu: n-butyl; sBu: sec-butyl; iBu: iso-butyl; tBu: tert-butyl; Cp: cyclopentadienyl; THD: 2,2,6,6-tetramethyl-3,5-heptanedionate; TMPD: 2,2,6,6-tetramethylpiperidide; acac: acetylacetonate; hfac: hexafluoroacetylacetonate; and FOD: 6,6,7,7,8,8,8-heptafluoro-2,2-dimethyl-3,5-octanedionate.

Still referring to FIG. 4A, the oxygen-containing gas supply system 46 is configured to introduce an oxygen-containing gas to the process chamber 10. The oxygen-containing gas can include, but is not limited to, $O_2$, water ($H_2O$), or peroxide ($H_2O_2$), or a combination thereof, and optionally an inert gas such as Ar. Similarly, the nitrogen-containing gas supply system 48 is configured to introduce a nitrogen-containing gas to the process chamber 10. Examples of nitrogen-containing gases include, but are not limited to, ammonia ($NH_3$), hydrazine ($N_2H_4$), and $C_1$-$C_{10}$ alkylhydrazine compounds. Common $C_1$ and $C_2$ alkylhydrazine compounds include monomethyl-hydrazine ($MeNHNH_2$), 1,1-dimethyl-hydrazine ($Me_2NNH_2$), and 1,2-dimethyl-hydrazine (MeNHNHMe). According to one embodiment of the invention, an oxygen- and nitrogen-containing gas may be utilized, for example, NO, $NO_2$, or $N_2O$, or a combination thereof, and optionally an inert gas such as Ar.

Embodiments of the inventions may utilize a wide variety of different Group II (alkaline earth) precursors. For example, many Group II precursors have the formula:

$$ML^1L^2D_x$$

where M is an alkaline earth metal element selected from the group of beryllium (Be), magnesium (Mg), calcium (Ca), strontium (Sr), and barium (Ba). $L^1$ and $L^2$ are individual anionic ligands, and D is a neutral donor ligand where x can be 0, 1, 2, or 3. Each $L^1$, $L^2$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Examples of L group alkoxides include tert-butoxide, isopropoxide, ethoxide, 1-methoxy-2,2-dimethyl-2-propionate (mmp), 1-dimethylamino-2,2'-dimethyl-propionate, amyloxide, and neo-pentoxide. Examples of halides include fluoride, chloride, iodide, and bromide. Examples of aryloxides include phenoxide and 2,4,6-trimethylphenoxide. Examples of amides include bis(trimethylsilyl)amide di-tert-butylamide, and 2,2,6,6-tetramethylpiperidide (TMPD). Examples of cyclepentadienyls include cyclopentadienyl, 1-methylcyclopentadienyl, 1,2,3,4-tetramethylcyclopentadienyl, 1-ethylcyclopentadienyl, pentamethylcyclopentadienyl, 1-isopropylcyclopentadienyl, 1-n-propylcyclopentadienyl, and 1-n-butylcyclopentadienyl. Examples of alkyls include bis(trimethylsilyl)methyl, tris(trimethylsilyl)methyl, and trimethylsilylmethyl. An example of a silyl is trimethylsilyl. Examples of amidinates include N,N'-di-tert-butylacetamidinate, N,N'-di-iso-propylacetamidinate, N,N'-di-isopropyl-2-tert-butylamidinate, and N,N'-di-tert-butyl-2-tert-butylamidinate. Examples of β-diketonates include 2,2,6,6-tetramethyl-3,5-heptanedionate (THD), hexafluoro-2,4-pentanedionate (hfac), and 6,6,7,7,8,8,8-heptafluoro-2,2-dimethyl-3,5-octanedionate (FOD). An example of a ketoiminate is 2-iso-propylimino-4-pentanonate. Examples of silanoates include tri-tert-butylsiloxide and triethylsiloxide. An example of a carboxylate is 2-ethylhexanoate.

Examples of D ligands include tetrahydrofuran, diethylether, 1,2-dimethoxyethane, diglyme, triglyme, tetraglyme, 12-Crown-6,10-Crown-4, pyridine, N-methylpyrrolidine, triethylamine, trimethylamine, acetonitrile, and 2,2-dimethylpropionitrile.

Representative examples of Group II (alkaline earth) precursors include:

Be precursors: $Be(N(SiMe_3)_2)_2$, $Be(TMPD)_2$, and $BeEt_2$.

Mg precursors: $Mg(N(SiMe_3)_2)_2$, $Mg(TMPD)_2$, $Mg(PrCp)_2$, $Mg(EtCp)_2$, and $MgCp_2$.

Ca precursors: $Ca(N(SiMe_3)_2)_2$, $Ca(iPr_4Cp)_2$, and $Ca(Me_5Cp)_2$.

Sr precursors: Bis(tert-butylacetamidinato)strontium (TBAASr), $Sr(N(SiMe_3)_2)_2$, $Sr(THD)_2$, $Sr(THD)_2$(tetraglyme), $Sr(iPr_4Cp)_2$, $Sr(iPr_3Cp)_2$, and $Sr(Me_5Cp)_2$.

Ba precursors: Bis(tert-butylacetamidinato)barium (TBAABa), $Ba(N(SiMe_3)_2)_2$, $Ba(THD)_2$, $Ba(THD)_2$(tetraglyme), $Ba(iPr_4Cp)_2$, $Ba(Me_5Cp)_2$, and $Ba(nPrMe_4Cp)_2$.

Embodiments of the inventions may utilize a wide variety of different precursors for Group XIII high-k forming elements (B, Al, Ga, In, Tl) into the hafnium zirconium based films. For example, many Al precursors have the formula:

$$AlL^1L^2L^3D_x$$

where $L^1$, $L^2$, $L^3$ are individual anionic ligands, and D is a neutral donor ligand where x can be 0, 1, or 2. Each $L^1$, $L^2$, $L^3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrrolidines, amines, crown ethers, glymes, and nitriles.

Other examples of Al precursors include: $Al_2Me_6$, $Al_2Et_6$, $[Al(O(sBu))_3]_4$, $Al(CH_3COCHCOCH_3)_3$, $AlBr_3$, $AlI_3$, $Al(O(iPr))_3$, $[Al(NMe_2)_3]_2$, $Al(iBu)_2Cl$, $Al(iBu)_3$, $Al(iBu)_2H$, $AlEt_2Cl$, $Et_3Al_2(O(sBu))_3$, and $Al(THD)_3$.

Examples of Ga precursors include $GaCl_3$ and $GaH_3$, examples of In precursors include $InCl_3$ and $InH_3$, and examples of B precursors include borane ($BH_3$), diborane ($B_2H_6$), tri-ethylboron ($BEt_3$), triphenylboron ($BPh_3$), and borane adducts such as $Me_3N{:}BH_3$, and $BCl_3$.

Embodiments of the invention may utilize a wide variety of silicon precursors for incorporating silicon into the films or layers. Examples of silicon precursors include, but are not limited to, silane ($SiH_4$), disilane ($Si_2H_6$), monochlorosilane ($SiClH_3$), dichlorosilane ($SiH_2Cl_2$), trichlorosilane ($SiHCl_3$), hexachlorodisilane ($Si_2Cl_6$), diethylsilane ($Et_2SiH_2$), and alkylaminosilane compounds. Examples of alkylaminosilane compounds include, but are not limited to, di-isopropylaminosilane ($H_3Si(NPr_2)$), bis(tert-butylamino)silane (($C_4H_9(H)N)_2SiH_2$), tetrakis(dimethylamino)silane ($Si(NMe_2)_4$), tetrakis(ethylmethylamino)silane ($Si(NEtMe)_4$), tetrakis(diethylamino)silane ($Si(NEt_2)_4$), tris(dimethylamino)silane ($HSi(NMe_2)_3$), tris(ethylmethylamino)silane ($HSi(NEtMe)_3$), tris(diethylamino)silane ($HSi(NEt_2)_3$), and tris(dimethylhydrazino)silane ($HSi(N(H)NMe_2)_3$), bis(diethylamino)silane ($H_2Si(NEt_2)_2$), bis(di-isopropylamino)silane ($H_2Si(NPr_2)_2$), tris(isopropylamino)silane ($HSi(NPr_2)_3$), and (di-isopropylamino)silane ($H_3Si(NPr_2)$).

Still referring to FIG. 4A, the purge gas supply system 44 is configured to introduce a purge gas to process chamber 10. For example, the introduction of purge gas may occur between introduction of pulses of first and second precursors and an oxygen-containing gas, a nitrogen-containing gas, an oxygen- and a nitrogen-containing gas, or a high-k forming gas to the process chamber 10. The purge gas can contain an inert gas, such as a noble gas (i.e., He, Ne, Ar, Kr, Xe), nitrogen ($N_2$), or hydrogen ($H_2$).

Furthermore, processing system 1 includes substrate temperature control system 60 coupled to the substrate holder 20 and configured to elevate and control the temperature of substrate 100. Substrate temperature control system 60 contains temperature control elements, such as a cooling system including a re-circulating coolant flow that receives heat from substrate holder 20 and transfers heat to a heat exchanger system (not shown), or when heating, transfers heat from the heat exchanger system. Additionally, the temperature control elements can include heating/cooling elements, such as resistive heating elements, or thermo-electric heaters/coolers, which can be included in the substrate holder 20, as well as the chamber wall of the process chamber 10 and any other component within the processing system 1. The substrate temperature control system 60 can, for example, be configured to elevate and control the substrate temperature from room temperature to approximately 350° C. to 550° C. Alternatively, the substrate temperature can, for example, range from approximately 150° C. to 350° C. It is to be understood, however, that the temperature of the substrate is selected based on the desired temperature for causing deposition of a particular dielectric material on the surface of a given substrate.

In order to improve the thermal transfer between substrate 100 and substrate holder 20, substrate holder 20 can include a mechanical clamping system, or an electrical clamping system, such as an electrostatic clamping system, to affix substrate 100 to an upper surface of substrate holder 20. Furthermore, substrate holder 20 can further include a substrate backside gas delivery system configured to introduce gas to the back-side of substrate 100 in order to improve the gas-gap thermal conductance between substrate 100 and substrate holder 20. Such a system can be utilized when temperature control of the substrate is required at elevated or reduced temperatures. For example, the substrate backside gas system can contain a two-zone gas distribution system, wherein the helium gas gap pressure can be independently varied between the center and the edge of substrate 100.

Furthermore, the process chamber 10 is further coupled to a pressure control system 32, including a vacuum pumping system 34 and a valve 36, through a duct 38, wherein the pressure control system 32 is configured to controllably evacuate the process chamber 10 to a pressure suitable for forming the thin film on substrate 100, and suitable for use of the first and second process materials. The vacuum pumping system 34 can include a turbo-molecular vacuum pump (TMP) or a cryogenic pump capable of a pumping speed up to about 5000 liters per second (and greater) and valve 36 can include a gate valve for throttling the chamber pressure. Moreover, a device for monitoring chamber pressure (not shown) can be coupled to the process chamber 10. The pressure control system 32 can, for example, be configured to control the process chamber pressure between about 0.1 Torr and about 100 Torr during deposition of the high-k materials.

The first precursor supply system 40, second precursor supply system 42, purge gas supply system 44, oxygen-containing gas supply system 46, the nitrogen-containing gas supply system 48, and auxiliary gas supply system 50 can include one or more pressure control devices, one or more flow control devices, one or more filters, one or more valves, and/or one or more flow sensors. The flow control devices can include pneumatic driven valves, electro-mechanical (solenoidal) valves, and/or high-rate pulsed gas injection valves. According to embodiments of the invention, gases may be sequentially and alternately pulsed into the process chamber 10, where the length of each gas pulse can, for example, be between about 0.1 sec and about 100 sec. Alternately, the length of each gas pulse can be between about 1 sec and about 10 sec. Exemplary gas pulse lengths for precursor gases can be between 0.3 and 3 sec, for example 1 sec. Exemplary gas pulse lengths for an oxygen-containing gas, a nitrogen-containing gas, and an oxygen- and nitrogen-containing gas can be between 0.3 and 3 sec, for example 1 sec. Exemplary purge gas pulses can be between 1 and 20 sec, for example 3 sec. An exemplary pulsed gas injection system is described in greater detail in pending U.S. Patent Application Publication No. 2004/0123803.

Still referring to FIG. 4A, controller 70 can contain a microprocessor, memory, and a digital I/O port capable of generating control voltages sufficient to communicate and activate inputs to the processing system 1 as well as monitor outputs from the processing system 1. Moreover, the controller 70 may be coupled to and may exchange information with the process chamber 10, substrate holder 20, upper assembly 30, first precursor supply system 40, second precursor supply system 42, purge gas supply system 44, oxygen-containing gas supply system 46, nitrogen-containing gas supply system 48, auxiliary gas supply system 50, substrate temperature control system 60, substrate temperature control system 60, and pressure control system 32. For example, a program stored in the memory may be utilized to activate the inputs to the aforementioned components of the processing system 1 according to a process recipe in order to perform a deposition process.

However, the controller 70 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The controller 70 includes at least one computer readable medium or memory, such as the controller memory, for holding instructions programmed according to the teachings of the invention and for containing data structures, tables, records, or other data that may be necessary to implement the present invention. Examples of computer readable media are compact discs, hard disks, floppy disks, tape, magneto-optical disks, PROMs (EPROM, EEPROM, flash EPROM), DRAM, SRAM, SDRAM, or any other magnetic medium, compact discs (e.g., CD-ROM), or any other optical medium, punch cards, paper tape, or other physical medium with patterns of holes, a carrier wave (described below), or any other medium from which a computer can read.

Stored on any one or on a combination of computer readable media, resides software for controlling the controller 70, for driving a device or devices for implementing the invention, and/or for enabling the controller to interact with a human user. Such software may include, but is not limited to, device drivers, operating systems, development tools, and applications software. Such computer readable media further includes the computer program product of the present invention for performing all or a portion (if processing is distributed) of the processing performed in implementing embodiments of the invention.

The computer code devices may be any interpretable or executable code mechanism, including but not limited to scripts, interpretable programs, dynamic link libraries (DLLs), Java classes, and complete executable programs. Moreover, parts of the processing of the present invention may be distributed for better performance, reliability, and/or cost.

The term "computer readable medium" as used herein refers to any medium that participates in providing instructions to the processor of the controller 70 for execution. A computer readable medium may take many forms, including but not limited to, non-volatile media, volatile media, and transmission media. Non-volatile media includes, for example, optical, magnetic disks, and magneto-optical disks, such as the hard disk or the removable media drive. Volatile media includes dynamic memory, such as the main memory. Moreover, various forms of computer readable media may be involved in carrying out one or more sequences of one or more instructions to processor of controller for execution. For example, the instructions may initially be carried on a magnetic disk of a remote computer. The remote computer can load the instructions for implementing all or a portion of the present invention remotely into a dynamic memory and send the instructions over a network to the controller 70.

The controller 70 may be locally located relative to the processing system 1, or it may be remotely located relative to the processing system 1. For example, the controller 70 may exchange data with the processing system 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the processing system 1 via a wireless connection.

Figure 4B:
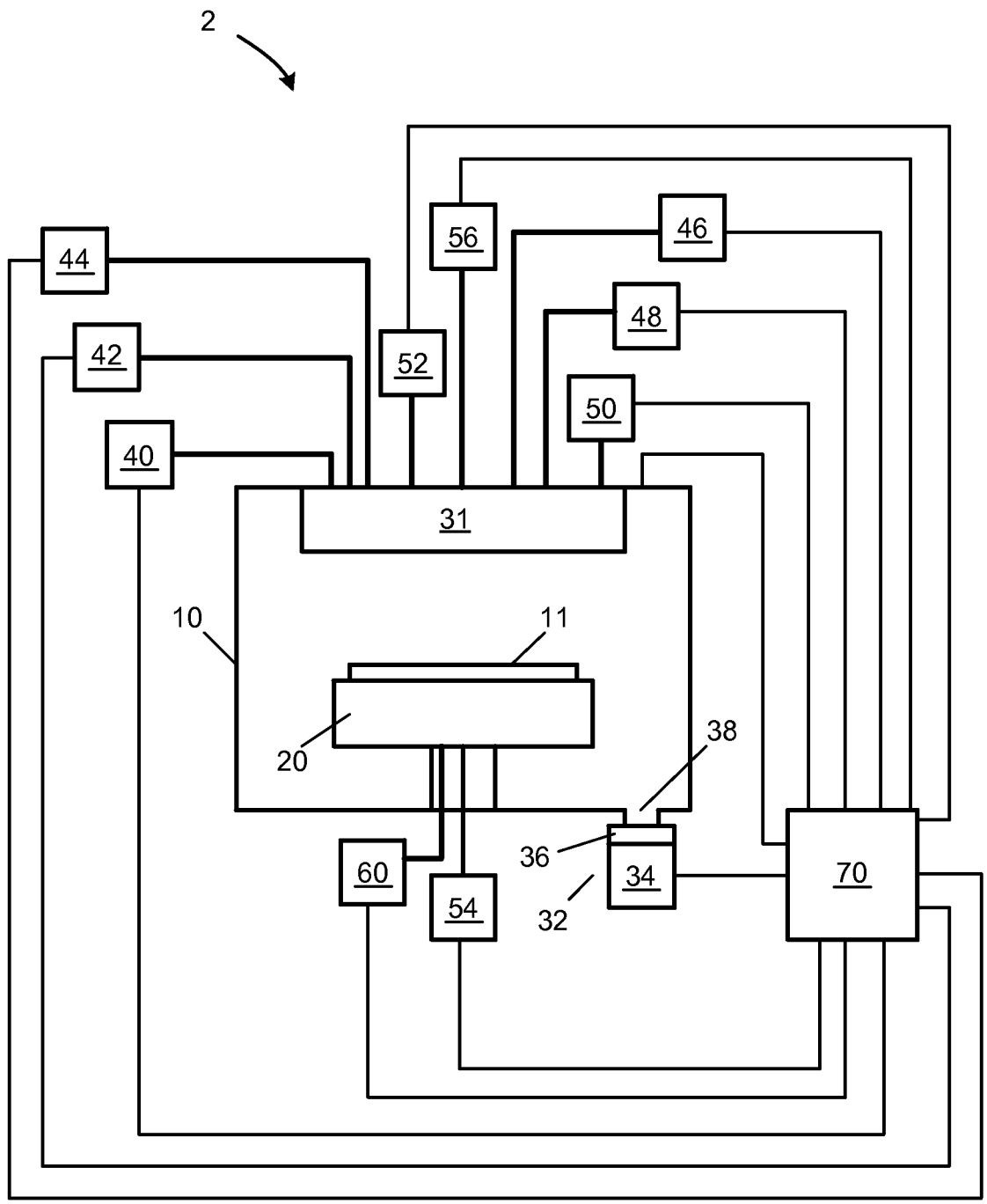

FIG. 4B illustrates a plasma processing system 2 that may be utilized for depositing one or more of the films and layers described above, including the first high-k film 104, the first threshold voltage adjustment layer 108, and the second threshold voltage adjustment layer 122 according to embodiments of the invention. The plasma processing system 2 may be configured for performing PEALD or PECVD processing, in addition being able to perform ALD or CVD processing. The plasma processing system 2 is similar to the processing system 1 described in FIG. 4A, but further includes a plasma generation system configured to generate a plasma during at least a portion of the gas exposures in the process chamber 10. This allows formation of ozone and plasma excited oxygen from an oxygen-containing gas containing $O_2$, $H_2O$, $H_2O_2$, or a combination thereof. Similarly, plasma excited nitrogen may be formed from a nitrogen-containing gas containing $N_2$, $NH_3$, or $N_2H_4$, or $C_1$-$C_{10}$ alkylhydrazine compounds, or a combination thereof.

Also, plasma excited oxygen and nitrogen may be formed from a process gas containing NO, $NO_2$, and $N_2O$, or a combination thereof. The plasma generation system includes a first power source 52 coupled to the process chamber 10, and configured to couple power to gases introduced into the process chamber 10. The first power source 52 may be a variable power source and may include a radio frequency (RF) generator and an impedance match network, and may further include an electrode through which RF power is coupled to the plasma in process chamber 10. The electrode can be formed in the upper assembly 31, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in process chamber 10 by reducing the reflected power. Match network topologies (e.g. L-type, π-type, T-type, etc.) and automatic control methods are well known to those skilled in the art.

Alternatively, the first power source 52 may include a RF generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 52 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, the entire content of which is incorporated herein by reference.

According to one embodiment of the invention, the plasma processing system 2 includes a substrate bias generation system configured to generate or assist in generating a plasma (through substrate holder biasing) during at least a portion of the alternating introduction of the gases to the process chamber 10. The substrate bias system can include a substrate power source 54 coupled to the process chamber 10, and configured to couple power to the substrate 100. The substrate power source 54 may include a RF generator and an impedance match network, and may further include an electrode through which RF power is coupled to substrate 100. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz, and can be 13.56 MHz. RF bias systems for plasma processing are well known to those skilled in the art. Alternatively, RF power is applied to the substrate holder electrode at multiple frequencies. Although the plasma generation system and the substrate bias system are illustrated in FIG. 4B as separate entities, they may indeed contain one or more power sources coupled to substrate holder 20.

In addition, the plasma processing system 2 includes a remote plasma system 56 for providing and remotely plasma exciting an oxygen-containing gas, a nitrogen-containing gas, or a combination thereof, prior to flowing the plasma excited gas into the process chamber 10 where it is exposed to the substrate 100. The remote plasma system 56 can, for example, contain a microwave frequency generator. The process chamber pressure can be between about 0.1 Torr and about 10 Torr, or between about 0.2 Torr and about 3 Torr.

A plurality of embodiments for integrating buried voltage threshold voltage layers for CMOS process have been described. The method provides a modified interface layer with low EOT and forms a high-k film diffused with metal elements that shift the threshold voltage that is appropriate for the first and second device regions (e.g., NMOS and PMOS device regions). The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims), unless specifically stated, does not require that a film "on" a substrate is directly on and in immediate contact with the substrate; there may be a second film or other structure between the film and the substrate unless otherwise specified.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a semiconductor device, comprising:
   providing a substrate defined with a first device region and a second device region and having an interface layer on the first device region and on the second device region, said interface layer comprising an oxide or oxynitride;
   depositing a first high-k film on the interface layer;
   performing a heat-treatment to form a modified interface layer by diffusion of a metal element from the first high-k film into the interface layer;
   depositing a first threshold voltage adjustment layer on the first high-k film, wherein the first threshold voltage adjustment layer contains a first metal element selected from Mg, Ca, Sr, Ba, Sc, Ti, Y, La, V, Nb, Ta, Al, Ga, In, Tl, Ce, Pr, Nd, Pm, Sm, Eu, Gd, Tb, Dy, Ho, Er, Tm, Yb, or Lu, or a combination thereof;
   removing the first threshold voltage adjustment layer from the second device region;
   following the removing, depositing a second threshold voltage adjustment layer over the first high-k film;
   thereafter, depositing a second high-k film above the first high-k film;
   depositing a gate electrode film on the second high-k film;
   defining a first gate stack in the first device region, the first gate stack containing the modified interface layer, the first high-k film, the first threshold voltage adjustment layer, the second threshold layer, the second high-k film, and the gate electrode film; and
   defining a second gate stack in the second device region, the second gate stack containing the modified interface layer, the first high-k film, the second threshold layer, the second high-k film, and the gate electrode film,
   wherein the second threshold voltage adjustment layer abuts the second high-k film and the first threshold voltage adjustment layer in the first device region, and wherein the second threshold voltage adjustment layer abuts the second high-k film and the first high-k film in the second device region.

2. The method of claim 1, wherein the metal element in the first high-k film includes Be, Mg, Ca, Sr, Ba, Sc, Ti, Hf, Zr, Y, La, V, Nb, Ta, Al, Ga, In, Tl, Ce, Pr, Nd, Pm, Sm, Eu, Gd, Tb, Dy, Ho, Er, Tm, Yb, or Lu, or a combination thereof.

3. The method of claim 1, wherein the second high-k film includes Be, Mg, Ca, Sr, Ba, Sc, Ti, Hf, Zr, Y, La, V, Nb, Ta, Al, Ga, In, Tl, Ce, Pr, Nd, Pm, Sm, Eu, Gd, Tb, Dy, Ho, Er, Tm, Yb, or Lu, or a combination thereof.

4. The method of claim 1, wherein the second high-k film contains a different material than the first high-k film.

5. The method of claim 1, further comprising:
   performing an additional heat-treatment to diffuse the first metal element from the first threshold voltage adjustment layer into the first high-k film.

6. The method of claim 1, further comprising:
   removing the second threshold voltage adjustment layer from the first device region, wherein the second threshold voltage adjustment layer abuts the second high-k film and the first high-k film in the second device region.

7. The method of claim 1, wherein the second threshold voltage adjustment layer includes a metal or a metal-oxide layer containing a second metal element that is different from the first metal element of the first threshold voltage adjustment layer and is selected from Ti, Ta, Al, Ga, Mg, Ca, Sr, Ba, Sc, Y, La, V, Nb, Ta, In, Tl, Ce, Pr, Nd, Pm, Sm, Eu, Gd, Tb, Dy, Ho, Er, Tm, Yb, or Lu, or a combination thereof.

8. The method of claim 7, further comprising:
   performing an additional heat-treatment to diffuse the second metal element from the second threshold voltage adjustment layer into the first high-k film.

9. The method of claim 1, wherein the modified interface layer has an equivalent oxide thickness (EOT) that is equal to or lower than the EOT of the interface layer.

* * * * *